(12) United States Patent
Tateoka et al.

(10) Patent No.: US 7,679,438 B2
(45) Date of Patent: Mar. 16, 2010

(54) HIGH FREQUENCY CIRCUIT, SEMICONDUCTOR DEVICE, AND HIGH FREQUENCY POWER AMPLIFICATION DEVICE

(75) Inventors: Kazuki Tateoka, Kyoto (JP); Masahiko Inamori, Osaka (JP); Shingo Matsuda, Kyoto (JP); Kazuhiko Ohashi, Osaka (JP); Haruhiko Koizumi, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/118,803

(22) Filed: May 12, 2008

(65) Prior Publication Data
US 2008/0284539 A1 Nov. 20, 2008

(30) Foreign Application Priority Data
May 16, 2007 (JP) .............................. 2007-130404

(51) Int. Cl.
*H03F 3/68* (2006.01)
(52) U.S. Cl. ..................................................... 330/126
(58) Field of Classification Search ................. 330/126, 330/302, 51
See application file for complete search history.

(56) References Cited

U.S. PATENT DOCUMENTS

| | | | |
|---|---|---|---|
| 5,774,017 A | 6/1998 | Adar | |
| 6,625,430 B2 * | 9/2003 | Doherty | 455/126 |
| 6,949,974 B2 * | 9/2005 | Ohnishi et al. | 330/124 R |
| 6,972,618 B2 * | 12/2005 | Kim et al. | 330/51 |
| 7,148,751 B2 * | 12/2006 | Weigand et al. | 330/307 |
| 7,345,534 B2 * | 3/2008 | Grebennikov | 330/51 |
| 7,545,208 B2 * | 6/2009 | Rodriguez | 330/58 |

FOREIGN PATENT DOCUMENTS

| | | |
|---|---|---|
| JP | 10-065466 A | 3/1998 |
| JP | 2005-086738 A | 3/2005 |

* cited by examiner

*Primary Examiner*—Henry K Choe
(74) *Attorney, Agent, or Firm*—RatnerPrestia

(57) ABSTRACT

A small, high performance, multifunctional high frequency circuit that is multiband and multimode compatible reduces loss from a switch formed on the output side of a final stage amplification unit. The final stage amplification unit power amplifies an input signal and outputs an amplified signal. A first matching circuit impedance converts the amplified signal input thereto at a first input impedance, and outputs a first impedance-converted signal at a first output impedance. A control unit that generates a control signal denoting signal path selection information. A switch unit selects one of at least two signal paths based on the control signal, passes the first impedance-converted signal at an on impedance through the selected path, and outputs the pass signal. A second matching circuit impedance converts a pass signal input thereto at a second input impedance, and outputs a second impedance-converted signal at a second output.

26 Claims, 23 Drawing Sheets

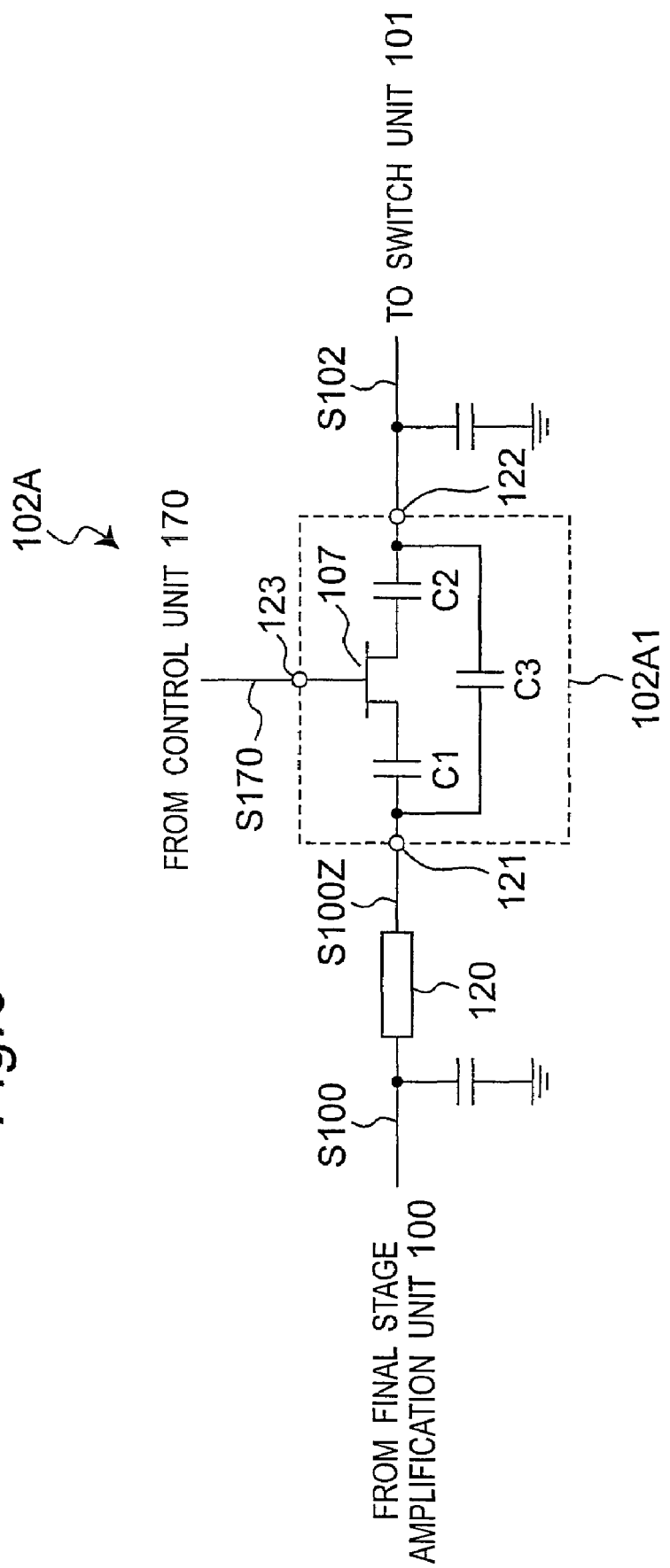

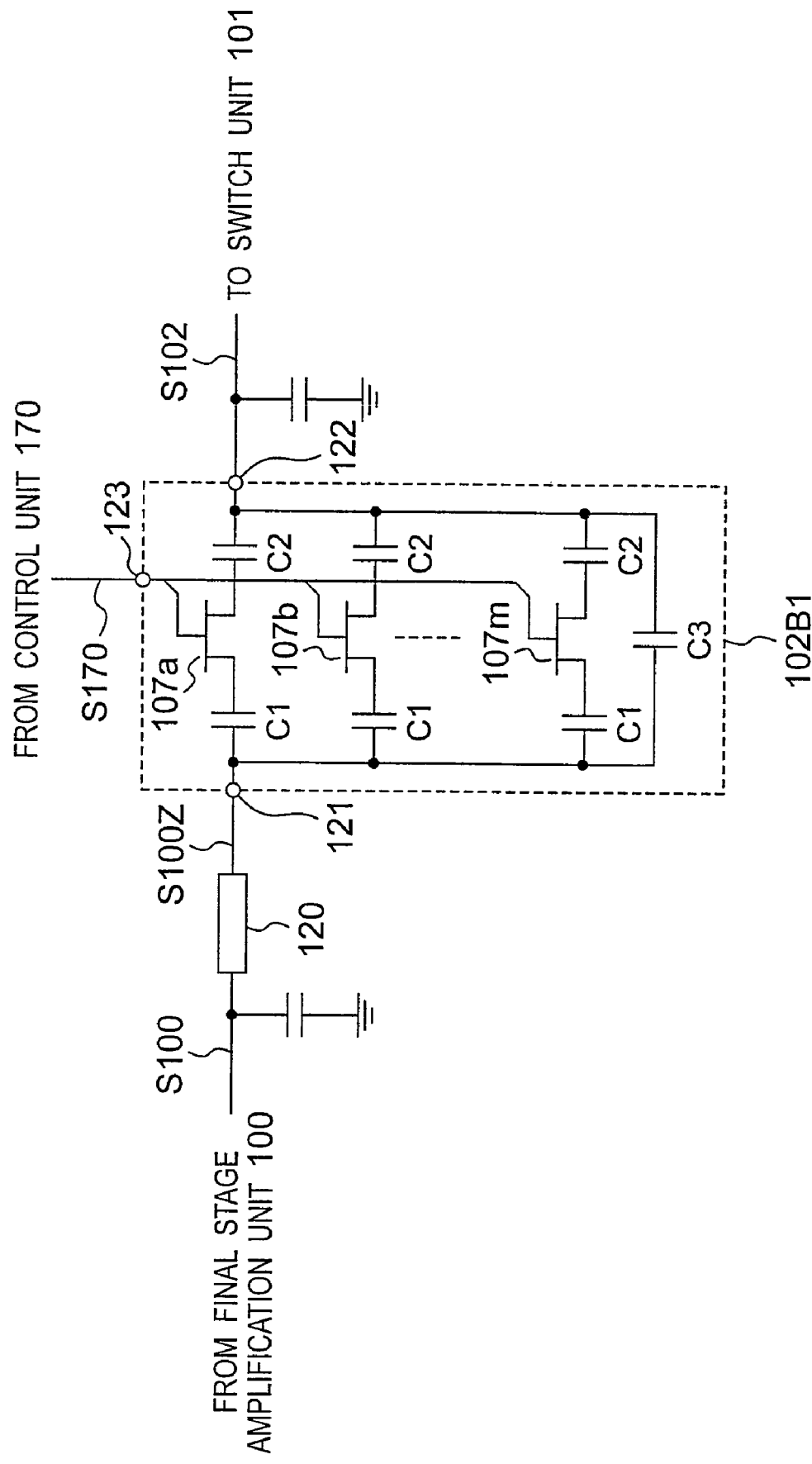

HIGH FREQUENCY CIRCUIT, SEMICONDUCTOR DEVICE, AND HIGH FREQUENCY POWER AMPLIFICATION DEVICE

BACKGROUND OF THE INVENTION

1. Field of Invention

The present invention relates to technology for a high frequency circuit that is used in mobile communication devices, for example, and to a high frequency power amplification device that uses the high frequency circuit, and relates more particularly to a high frequency circuit, to a semiconductor device, and to a high frequency power amplification device.

2. Description of Related Art

High frequency power amplifiers used in cell phones, for example, have an amplification device such as a transistor, an input matching circuit for efficiently inputting high frequency signals to the amplification device, and an output matching circuit for efficiently outputting high frequency signals from the amplification device. The matching circuits are composed of capacitors, inductors, microstrip lines, or other high frequency matching device, and are usually mounted on a circuit board as a semiconductor chip package. A semiconductor chip containing the high frequency power amplification device is also mounted on the same circuit board, rendering a high frequency power amplifier module.

As cell phones have become more functional, demand for multiband cell phones capable of transmitting various different signals and multimode cell phones capable of handling different modulation signals has risen. As known from the literature, input and output impedance matching under various frequency, output, and other conditions is necessary in order to optimize the efficiency of the high frequency power amplifier. A plurality of high frequency power amplifiers each having a matching circuit with optimized impedance is required for multiband and multimode compatibility.

One possible solution is a high frequency power amplifier that has a plurality of output pins and switches for selecting the appropriate output as described in the literature.

FIG. 18 shows an example of the related art taught in U.S. Pat. No. 5,774,017 (corresponding to Japanese Laid-open Patent Publication No. 10-65466). A single-pole, double-throw (SPDT) switch 265 is disposed to the output of the last amplification device 246. The output matching circuits 264, 266 are designed for matching signals of the two different frequencies that are amplified by the amplifier 240. The single-pole, double-throw switch 265 switches to pass the output of the amplification device 246 to the appropriate output matching circuit 264, 266.

FIG. 19 shows an example of the related art taught in Japanese Laid-open Patent Publication No. 2005-86738. A double-pole, double-throw (DPDT) switch 14 is connected to the outputs of the final amplification device 31 and the preceding amplification device. The output matching circuits 56, 56' are designed for matching signals of the two different frequencies that are amplified by the amplifier 50. The double-pole, double-throw switch 14 can switch the two inputs to the appropriate output matching circuits 56, 56'.

A problem with the related art thus described is that because a switching device must be connected before or after the final amplification stage, the switching device increases the output loss of the amplification device.

SUMMARY OF THE INVENTION

A first aspect of the invention is a multifunctional, compact, high performance high frequency circuit that reduces loss caused by a switching device disposed to the output side of the amplifier, enables easily switching the impedance and output path, and is multiband and multimode compatible.

A high frequency circuit according to a preferred aspect of the invention has a final stage amplification unit that power amplifies an input signal and outputs an amplified signal; a first matching circuit that impedance converts the amplified signal input thereto at a first input impedance, and outputs a first impedance-converted signal at a first output impedance; and a switch unit that switches passing the first impedance-converted signal on/off, and when on state passes the first impedance-converted signal at an on impedance and outputs the pass signal to an antenna.

Preferably, the high frequency circuit also has a control unit that generates a control signal denoting signal path selection information, and the switch unit selects one of at least two signal paths based on the control signal, and turns passing the first impedance-converted signal through the selected path on.

Further preferably, the high frequency circuit also has a second matching circuit that impedance converts a pass signal input thereto at a second input impedance, and outputs a second impedance-converted signal at a second output impedance to the antenna.

A semiconductor device according to another aspect of the invention includes at least a part of the first matching circuit and the first switch unit of the high frequency circuit described above on a first semiconductor chip.

Another aspect of the invention is a high frequency power amplification device having mounted on a single circuit board at least part of the first matching circuit and second matching circuit of the high frequency circuit described above, and the foregoing semiconductor device.

The high frequency circuit, semiconductor device, and high frequency power amplifier according to the present invention can reduce loss imposed by the switch unit by setting the output impedance of the matching circuit higher than the on impedance of the switch unit disposed downstream from the matching circuit. Furthermore, by using a switch unit from which loss is thus reduced, the input/output impedance of a matching circuit disposed downstream from the switch unit can be separately optimized for the frequency or power. Independently optimized matching circuits can therefore be appropriately applied in a multiband or multimode cell phone if the frequency band that is used changes or the communication mode changes. The matching circuit can therefore be reduced in size while transmission power efficiency and waveform precision are improved. Cell phone coverage can also be increased while power consumption is reduced. The invention thus affords a small, high performance, multifunctional high frequency circuit, semiconductor device, and high frequency power amplifier.

Other objects and attainments together with a fuller understanding of the invention will become apparent and appreciated by referring to the following description and claims taken in conjunction with the accompanying drawings.

BRIEF DESCRIPTION OF THE DRAWINGS

FIG. 6 is a circuit diagram showing an example of the matching circuit in a third embodiment of the invention.

FIG. 8 is a circuit diagram showing an example of the matching circuit according to a fourth embodiment of the invention.

DETAILED DESCRIPTION OF THE PREFERRED EMBODIMENTS

Figure 1:
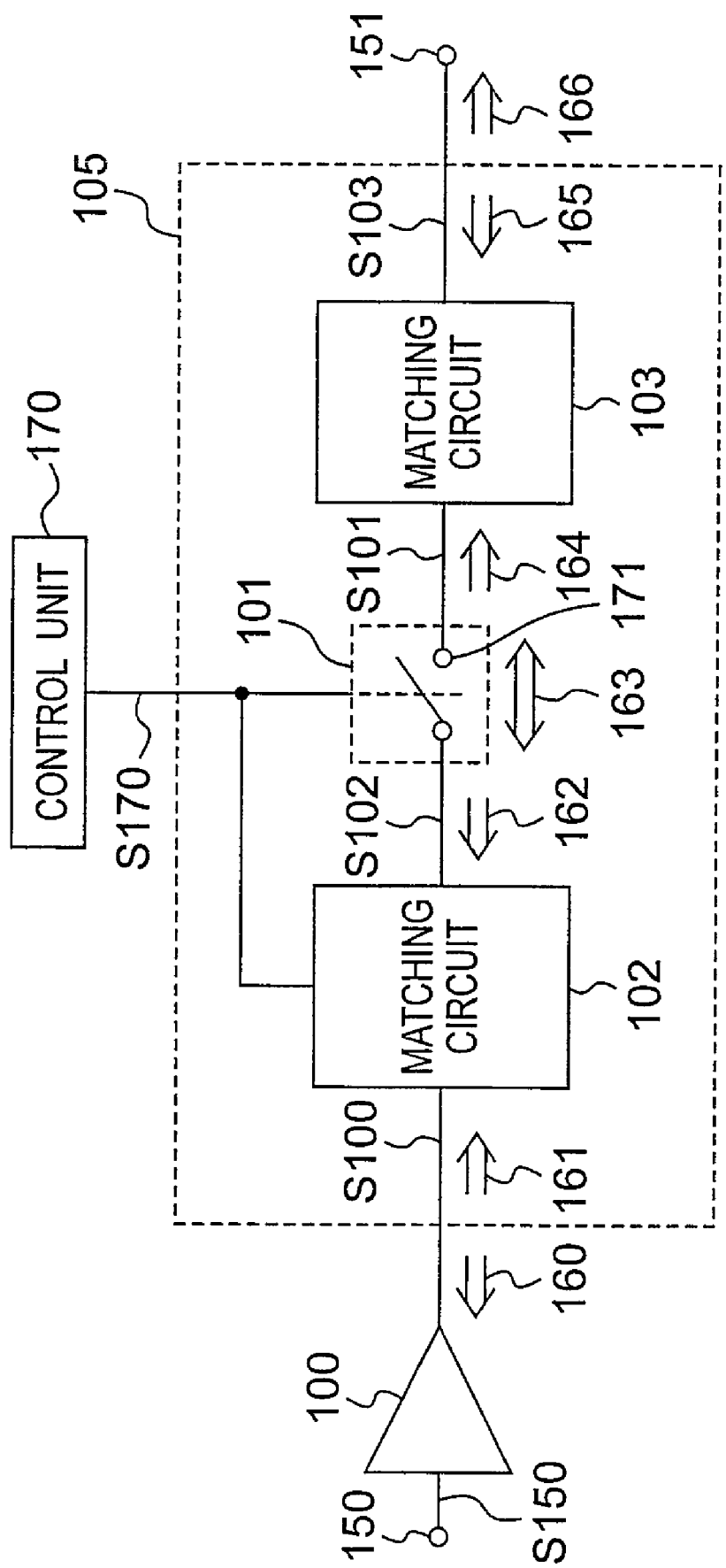
FIG. 1 is a block diagram of a high frequency circuit used to describe the principle of the invention.

Preferred embodiments of the present invention are described below with reference to the accompanying figures. Note that parts with the same arrangement, operation, and effect are denoted by the same reference numerals in the accompanying figures. The numbers used below and in the figures are also merely to describe a specific embodiment of the invention, and the invention is not limited to the cited numbers. In addition, logic levels denoted high and low are also only used by way of example to describe a specific embodiment of the invention, and it will be obvious that the same effect can be achieved using different combinations of the exemplary logic levels. Furthermore, the connections between particular parts described below are also used to describe a specific embodiment of the invention, and the connections achieving the function of the invention are not limited to those described below. The following embodiments are also rendering using hardware and/or software elements, but the hardware arrangements described below can also be achieved using software, and the software constructions described below can also be achieved using hardware.

Operating Principle

The operating principle of the invention is described first below. FIG. 1 is a block diagram of a high frequency circuit used to describe the principle of the invention. The high frequency circuit used to describe this principle has an input pin 150, final stage amplification unit 100, matching circuit 102, switch unit 101, matching circuit 103, output pin 151, and control unit 170.

The final stage amplification unit 100 is an amplifier circuit including the last amplification device that outputs to an antenna (not shown in the figure), for example. The final stage amplification unit 100 amplifies the power of the input signal S150 input to the input pin 150, and outputs the amplified signal S100 at output impedance 160. The output impedance 160 is normally less than 50Ω. If the output of the final stage amplification unit 100 is high, such as when a 1-W input is boosted to several watts as in a cell phone, the output impedance 160 is generally approximately 3 to 8Ω.

The amplified signal S100 is input to the matching circuit 102 at an input impedance 161 substantially equal to a complex conjugate of the output impedance 160. More specifically, the matching circuit 102 extracts the maximum power from the final stage amplification unit 100 by impedance matching the output impedance 160. Similarly to the output impedance 160, the input impedance 161 is typically 3-8Ω. The matching circuit 102 impedance converts the amplified signal S100, and outputs an impedance-converted signal S102 at output impedance 162.

The control unit 170 generates a control signal S170 denoting signal path selection information applied to the switch unit 101. The matching circuit 102 controls the output impedance 162 based on control signal S170. Also based on the control signal S170, the switch unit 101 switches the impedance-converted signal S102 on/off, and passes and outputs the impedance-converted signal S102 as pass signal S101 at on impedance 163 if the switch is on.

The pass signal S101 is input to the matching circuit 103 at an input impedance 164 substantially equal to a complex conjugate of a complex sum of the output impedance 162 and the on impedance 163. That is, the matching circuit 103 extracts the maximum power from the matching circuit 102 by impedance matching the output impedance 162 and on impedance 163. In addition, the matching circuit 103 impedance converts the pass signal S101 and outputs impedance-converted signal S103 to the output pin 151 at output impedance 165, which is substantially equal to load impedance 166. The load impedance 166 is the impedance of the load connected to the output pin 151. For example, if the load impedance 166 is a pure resistance of 50Ω, there may be a 50-Ω antenna connected through a 50-Ω transmission path (not shown in the figure). More specifically, by impedance matching the load impedance 166, the matching circuit 103 suppresses waveform distortion caused by reflection waves from the load while supplying the maximum power to the load. The switch unit 101 and matching circuits 102 and 103 constitute the load matching circuit 105. The impedances are expressed as complex numbers of which the real part is the resistance component and the imaginary part is the reactance.

When a switch unit 101 is disposed to the output side of the final stage amplification unit 100, signal loss by the switch unit 101 must be avoided. If the absolute value of the output impedance 162 of the matching circuit 102 is set higher than the absolute value of the on impedance 163, the sum of the complex values of output impedance 162 and on impedance 163 is substantially equal to output impedance 162. More particularly, the on impedance 163 is a level that can be ignored regardless of the phase, and signal loss by the switch unit 101 is reduced to a level that can be ignored.

For example, the on impedance 163 is typically approximately 1Ω, and the output impedance 162 is preferably set to 10Ω or greater and further preferably to several 10Ω. In this case the matching circuit 102 converts the typically 3-8Ω input impedance 161 to an output impedance 162 that is greater than the input impedance 161, and reduces signal loss from the switch unit 101. Because the input impedance 164 of the matching circuit 103 is substantially equal to a complex conjugate of the sum of complex numbers of the output impedance 162 and on impedance 163, the absolute value of the input impedance 164 increases approximately equally to the absolute value of the output impedance 162.

The output impedance 162 and the load impedance 166 are compared next. As described above, because the input impedance 164 is substantially equal to a complex conjugate of the output impedance 162, their reactance components are mutually cancelled. As a result, the resistance component of the output impedance 162 is compared with the load impedance 166, which is substantially composed of a resistance component. If the absolute value of the output impedance 162 is sufficiently greater than the absolute value of the on impedance 163, the resistance component of the output impedance 162 can be greater or less than the load impedance 166. If the resistance component of the output impedance 162 is substantially equal to the load impedance 166, the matching circuit 103 can be omitted. If the resistance component of the output impedance 162 is different from the load impedance 166, the matching circuit 103 impedance converts the input impedance 164 to an output impedance 165 substantially equal to the load impedance 166. Note that the matching circuit 103 can also be omitted even when the resistance component of the output impedance 162 differs from the load impedance 166 if impedance matching to the load impedance 166 is not necessary.

By thus matching the output impedance 160 of the final stage amplification unit 100 at the input side, the load matching circuit 105 can extract maximum power from the final stage amplification unit 100. Furthermore, by matching the 50-Ω load impedance 166 at the output side, the load matching circuit 105 can supply maximum power to the load and can suppress waveform distortion by wave reflection from the load. Yet further, by internally setting the absolute value of the output impedance 162 of the matching circuit 102 higher than the absolute value of the on impedance 163 of the switch unit 101, the load matching circuit 105 can set the on impedance 163 to a relative level that can be ignored. More specifically, the matching circuit 102 sets the input impedance 161 relatively low to match the output impedance 160 of the final stage amplification unit 100, and sets the output impedance 162 enough greater than the input impedance 161 that the on impedance 163 can be ignored. As a result, loss from the switch unit 101 can be reduced, waveform distortion can be suppressed, and maximum power can be supplied to the load when setting the switch unit 101 on the output side of the final stage amplification unit 100.

Embodiment 1

Figure 2:
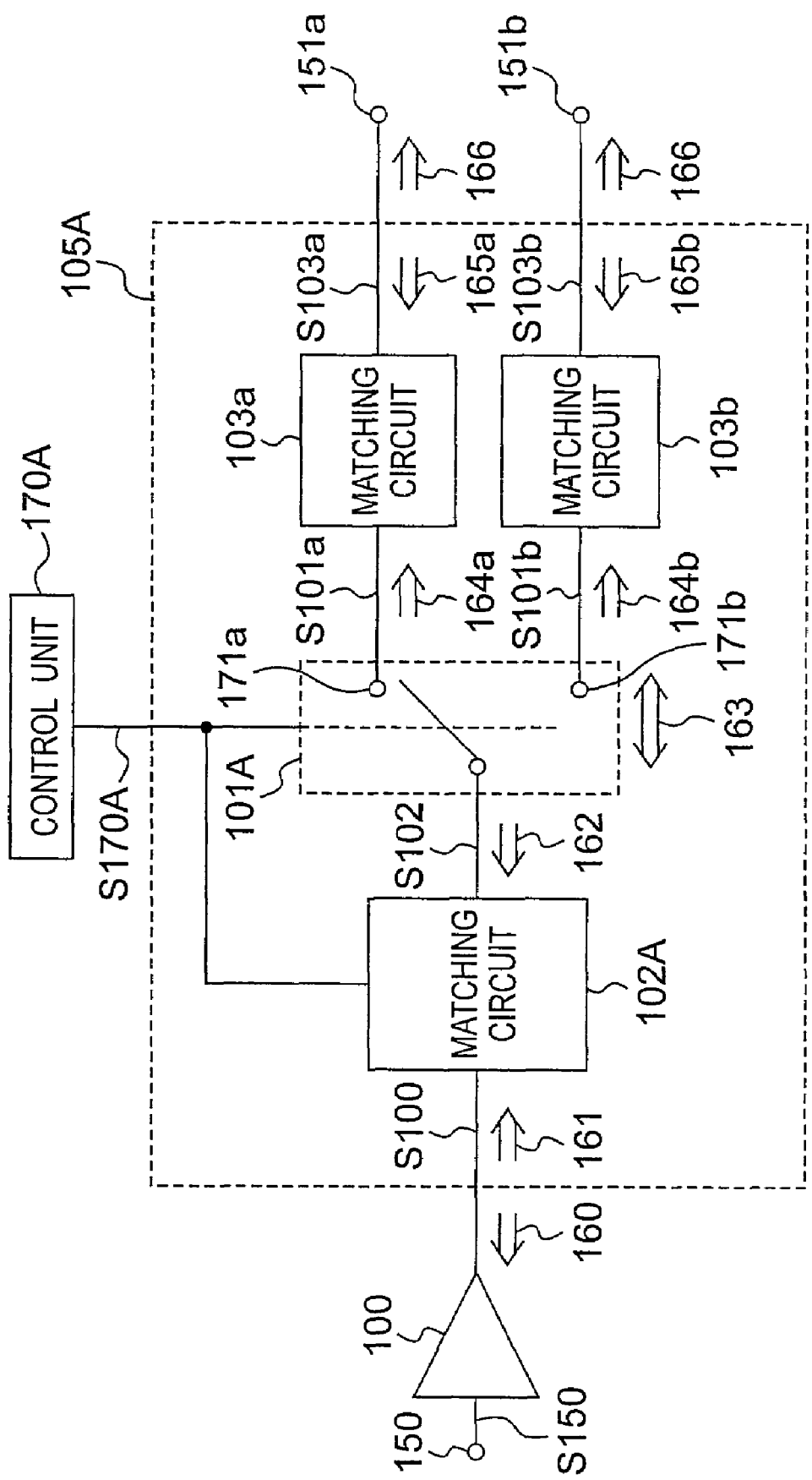
FIG. 2 is a block diagram of a high frequency circuit according to a first embodiment of the invention.

FIG. 2 is a block diagram of a high frequency circuit according to a first embodiment of the invention. The high frequency circuit according to this first embodiment of the invention includes an input pin 150, a final stage amplification unit 100, a matching circuit 102A, a switch unit 101A, matching circuits 103a and 103b, output pins 151a and 151b, and a control unit 170A.

The final stage amplification unit 100 amplifies the power of the input signal S150 input to the input pin 150, and outputs the amplified signal S100 at output impedance 160. The output impedance 160 is normally less than 50Ω. If the output of the final stage amplification unit 100 is high, such as when a 1-W input is boosted to several watts as in a cell phone, the output impedance 160 is generally approximately 3 to 8Ω.

The amplified signal S100 is input to the matching circuit 102A at an input impedance 161 substantially equal to a complex conjugate of the output impedance 160. More specifically, the matching circuit 102A extracts the maximum power from the final stage amplification unit 100 by impedance matching the output impedance 160. Similarly to the output impedance 160, the input impedance 161 is typically 3-8Ω. The matching circuit 102A converts the impedance of the amplified signal S100, and outputs an impedance-converted signal S102 at output impedance 162.

The switch unit 101A is a single-pole, double-throw switch. The control unit 170A generates a control signal S170A denoting signal path selection information applied to the switch unit 101A. The matching circuit 102A controls the output impedance 162 based on control signal S170A. Also based on the control signal S170A, the switch unit 101A selects path 171a or path 171b, and passes the impedance-converted signal S102 at on impedance 163 using the selected path. The switch unit 101A thus outputs pass signal S101a or pass signal S101b corresponding to the selected output path.

The pass signals S101a, S101b are input to the matching circuits 103a and 103b at an input impedance 164a, 164b substantially equal to a complex conjugate of a complex sum of the output impedance 162 and the on impedance 163. That is, the matching circuits 103a and 103b extract the maximum power from the matching circuit 102A by impedance matching the output impedance 162. In addition, the matching circuits 103a and 103b convert the impedance of the pass signals S101a, S101b and output impedance-converted signals S103a, S103b to the output pins 151a and 151b at output impedance 165a, 165b, which is substantially equal to load impedance 166. The load impedance 166 is the impedance of the load connected to the output pins 151a and 151b. For example, if the load impedance 166 is a pure resistance of 50Ω, there may be a 50-Ω antenna connected through a 50-Ω transmission path (not shown in the figure). By matching with the impedance of the amplified signal S100, the matching circuits 103a and 103b suppress waveform distortion caused by reflection waves from the load while supplying the maximum power to the load. The switch unit 101A and matching circuits 102A, 103a, 103b constitute a load matching circuit 105A. The impedances are expressed as complex numbers of which the real part is the resistance component and the imaginary part is the reactance.

Figure 3:
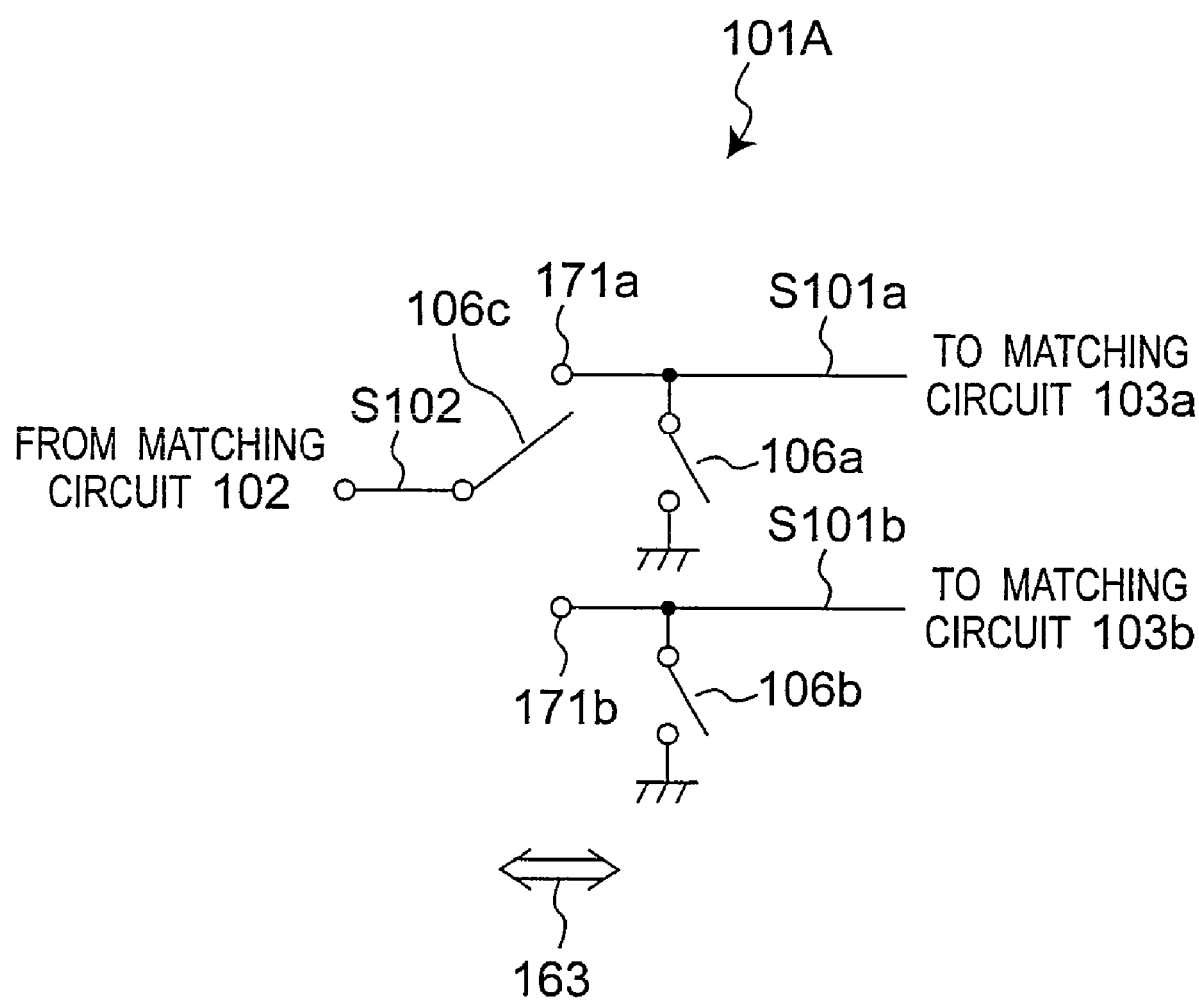
FIG. 3 is a circuit diagram showing the switch unit in the first embodiment of the invention.

FIG. 3 is a circuit diagram showing the switch unit 101A in the first embodiment of the invention. The switch unit 101A has a single-pole, double-throw switch 106c, and ground switches 106a, 106b on the output pin side. The switch unit 101A turns on the switch 106a, 106b on the path that is not selected. The unselected path therefore goes to ground, paths 171a and 171b are reliably isolated, and interference therebetween is reduced. In a device such as a cell phone that is densely populated with high frequency circuits, it is necessary to isolate such parallel processing circuits. The switches 106a, 106b can, however, be omitted.

When a switch unit 101A is disposed to the output side of the final stage amplification unit 100, signal loss by the switch unit 101A must be avoided. If the absolute value of the output impedance 162 of the matching circuit 102A is set higher than the absolute value of the on impedance 163, the sum of the complex values of output impedance 162 and on impedance 163 is substantially equal to output impedance 162. More particularly, the on impedance 163 is a level that can be ignored regardless of the phase, and signal loss by the switch unit 101A is reduced to a level that can be ignored.

For example, the on impedance 163 is typically approximately 1Ω, and the output impedance 162 is preferably set to 10Ω or greater and further preferably to several 10Ω. In this case the matching circuit 102A converts the typically 3-8Ω input impedance 161 to an output impedance 162 that is greater than the input impedance 161, and reduces signal loss from the switch unit 101A. Because the input impedance 164a, 164b of the matching circuits 103a and 103b is substantially equal to a complex conjugate of the sum of the complex variables of the output impedance 162 and on impedance 163, the absolute values of the input impedances 164a, 164b increase approximately equally to the absolute value of the output impedance 162.

The output impedance 162 and the load impedance 166 are compared next. As described above, because the input impedances 164a, 164b are substantially equal to a complex conjugate of the output impedance 162, their reactance components are mutually cancelled. As a result, the resistance component of the output impedance 162 is compared with the load impedance 166, which is substantially composed of a resistance component. If the absolute value of the output impedance 162 is sufficiently greater than the absolute value of the on impedance 163, the resistance component of the output impedance 162 can be greater or less than the load impedance 166. If the resistance component of the output impedance 162 is substantially equal to the load impedance 166, the matching circuits 103a and 103b can be omitted. If the resistance component of the output impedance 162 is different from the load impedance 166, the matching circuits 103a and 103b impedance convert the input impedance 164a, 164b to an output impedance 165a, 165b substantially equal to the load impedance 166. Note that the matching circuits 103a and 103b can also be omitted even when the resistance component of the output impedance 162 differs from the load impedance 166 if impedance matching to the load impedance 166 is not necessary.

FIG. 4A, FIG. 4B, FIG. 4C, and FIG. 4D are Smith charts describing the input/output impedance at various points in the first embodiment shown in FIG. 2. The center of the Smith chart denotes the 50-Ω characteristic impedance ZC with the left end being the shorted (0Ω) side. The control unit 170A generates a control signal S170A describing the frequency F1, F2 (where F1<F2) of the amplified signal S100. Based on this control signal S170A the switch unit 101A selects the paths 171a and 171b corresponding to the frequency F1, F2.

Figure 4A:
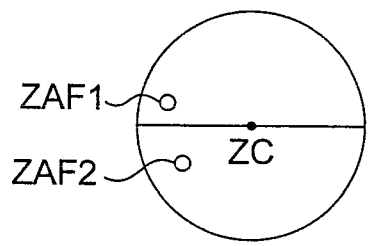
FIG. 4A describes the operation of the high frequency circuit according to the first embodiment of the invention.
Figure 4B:
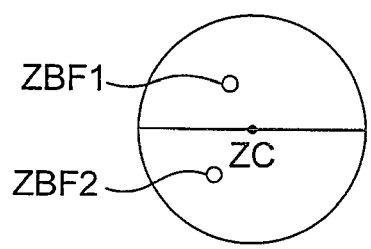
FIG. 4B describes the operation of the high frequency circuit according to the first embodiment of the invention.
Figure 4C:
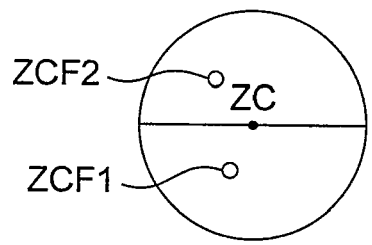
FIG. 4C describes the operation of the high frequency circuit according to the first embodiment of the invention.
Figure 4D:
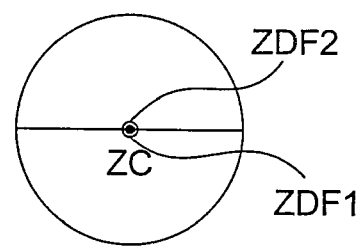
FIG. 4D describes the operation of the high frequency circuit according to the first embodiment of the invention.

FIG. 4A shows output impedance 160. FIG. 4B shows output impedance 162. FIG. 4C shows the input impedances 164a, 164b corresponding to frequencies F1, F2. FIG. 4D shows the output impedance 165a, 165b at frequency F1, F2. Impedances ZAF1, ZBF1, ZCF1, ZDF1 correspond to frequency F1, and impedances ZAF2, ZBF2, ZCF2, ZDF2 correspond to frequency F2. Because the final stage amplification unit 100, matching circuit 102A, switch unit 101A, and matching circuits 103a and 103b each have their own frequency characteristic, impedances ZAF1, ZBF1, and ZCF1 and impedances ZAF2, ZBF2, and ZCF2 are at different positions.

Impedances ZAF1, ZAF2 are lower than characteristic impedance ZC and near the short side. Impedances ZAF1, ZAF2 each contain a reactance component. Impedances ZAF1, ZAF2 are converted by the matching circuit 102A to a higher impedance ZBF1, ZBF2 and move closer to the characteristic impedance ZC. Impedances ZBF1, ZBF2 also each contain a reactance component. If the effect of the on impedance 163 is ignored, impedances ZCF1, ZCF2 are complex conjugates of impedances ZBF1, ZBF2. Impedances ZCF1, ZCF2 are converted by the matching circuits 103a and 103b, respectively, to approximately 50-Ω impedances ZDF1, ZDF2, which go to the characteristic impedance ZC and have a reactance component of zero.

As shown in FIG. 4B, the resistance components of impedances ZBF1, ZBF2 can differ, and the reactance components of impedances ZBF1, ZBF2 can differ. If the effect of the on impedance 163 is ignored, the reactance component of impedance ZBF1 and the reactance component of ZCF1 are mutually cancelling, and the reactance component of impedance ZBF2 and the reactance component of ZCF2 are mutually cancelling. Furthermore, if the resistance components of impedances ZBF1, ZBF2 are also substantially equal and the on impedance 163 is low enough that it can be ignored, compared with the resistance of ZBF1, ZBF2, insertion loss from the switch unit 101A can be reduced. In other words, in order to reduce insertion loss from the switch unit 101A, the resistance component of the output impedance 162 must be sufficiently greater than the on impedance 163 and substantially constant relative to each frequency F1, F2. More specifically, if the load impedance 166 is 50Ω, the resistance component of the output impedance 162 is set to 30-50Ω, for example.

In another specific example the control unit 170A generates a control signal S170A denoting the power level P1, P2 (where P1<P2) of the amplified signal S100. Based on this control signal S170A the switch unit 101A selects the paths 171a and 171b corresponding to the signal power P1, P2.

In yet another specific example the control unit 170A generates a control signal S170A denoting the frequency F1, F2 and the power level P1, P2 of the amplified signal S100. Based on this control signal S170A the switch unit 101A selects the paths 171a and 171b corresponding to the frequency F1, F2 and signal power P1, P2.

By thus matching the output impedance 160 of the final stage amplification unit 100 at the input side, the load matching circuit 105A in this first embodiment of the invention can extract maximum power from the final stage amplification unit 100. Furthermore, by matching the 50-Ω load impedance 166 at the output side, the load matching circuit 105A can supply maximum power to the load and can suppress waveform distortion by wave reflection from the load. Yet further, by internally setting the absolute value of the output impedance 162 of the matching circuit 102A higher than the absolute value of the on impedance 163 of the switch unit 101A, the load matching circuit 105A can set the on impedance 163 to a relative level that can be ignored. More specifically, the matching circuit 102A sets the input impedance 161 relatively low to match the output impedance 160 of the final stage amplification unit 100, and sets the output impedance 162 enough greater than the input impedance 161 that the on impedance 163 can be ignored. As a result, loss from the switch unit 101A can be reduced, waveform distortion can be suppressed, and maximum power can be supplied to the load when setting the switch unit 101A on the output side of the final stage amplification unit 100.

Furthermore, by using a switch unit 101A with low signal loss, the input impedance 164a, 164b and output impedance 165a, 165b of the matching circuits 103a and 103b can be individually optimized based on the frequency F1, F2 and power P1, P2. As a result, even if the selected frequency band of a multiband cell phone that is compatible with different wireless frequency bands changes, or the transmission power of a multimode cell phone that is compatible with different transmission systems changes, or if the combination of the selected frequency band and transmission power changes, the appropriately optimized matching circuit can be selected and used. As a result, the matching circuit is simplified and can be rendered smaller, the matching precision of each matching circuit can be improved, and transmission power efficiency and waveform precision can therefore be improved. The coverage area of the cell phone is therefore increased and power consumption is reduced.

This embodiment of the invention thus affords a small, high performance, and multifunctional high frequency circuit.

The switch unit 101A and matching circuit 102A are both controlled based on the control signal S170A in this embodiment, but the control signal S170A could be used to control only the switch unit 101A.

The final stage amplification unit 100 could also be a multistage amplifier.

Embodiment 2

The second embodiment of the invention is described next with particular attention to the differences with the first embodiment. Other aspects of the arrangement, operation, and effect of this embodiment are the same as in the first embodiment, and further description thereof is omitted.

Figure 5:
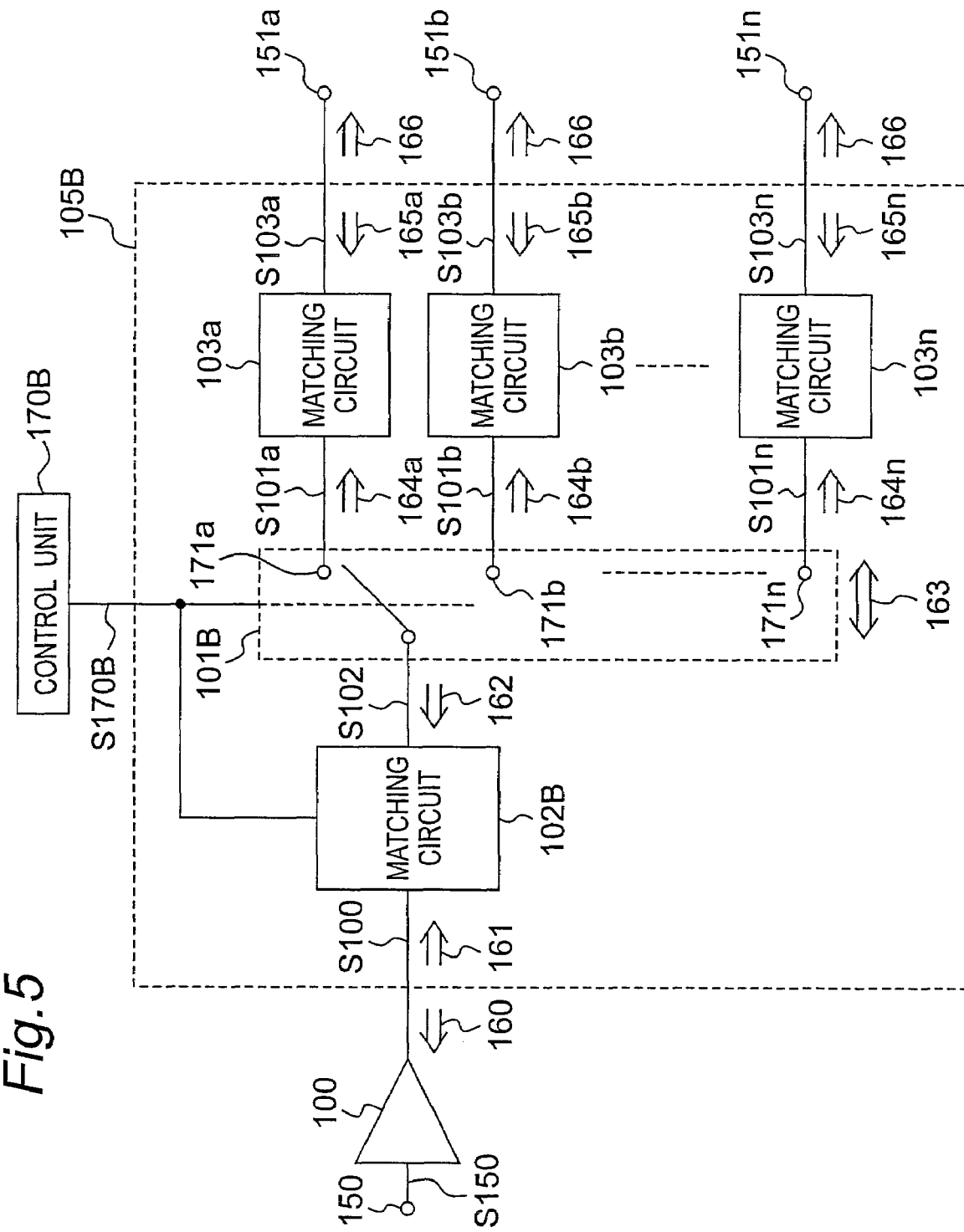
FIG. 5 is a block diagram of a high frequency circuit according to a second embodiment of the invention.

FIG. 5 is a block diagram of a high frequency circuit according to a second embodiment of the invention. The switch unit 101A of the first embodiment is replaced by a switch unit 101B in this second embodiment. The switch unit 101B is a single-pole, n-throw (where n is an integer of 3 or more) switch. The control unit 170B generates a control signal S170B denoting signal path selection information applied to the switch unit 101B. The matching circuit 102B controls the output impedance 162 based on control signal S170B. Also based on the control signal S170B, the switch unit 101B selects path 171a, 171b, to 171n and passes the impedance-converted signal S102 at on impedance 163 using the selected path. The switch unit 101B thus outputs pass signal S101a, pass signal S101b, . . . , pass signal S101n corresponding to the selected output path.

The pass signals S101a, S101b, to S101n are input to the matching circuits 103a, 103b, to 103n at an input impedance 164a, 164b, to 164n substantially equal to a complex conjugate of a complex sum of the output impedance 162 and the on impedance 163. That is, the matching circuits 103a, 103b, to 103n extract the maximum power from the matching circuit 102B by matching with the impedance of the output impedance 162. In addition, the matching circuits 103a, 103b, to 103n convert the impedance of the pass signals S101a, S101b to S101n and output impedance-converted signals S103a, S103b, to S103n to the output pins 151a, 151b to 151n at an output impedance 165a, 165b, to 165n which is substantially equal to load impedance 166. The load impedance 166 is the impedance of the load connected to the output pins 151a, 151b to 151n.

By impedance matching the load impedance 166, the matching circuits 103a, 103b, to 103n suppress waveform distortion caused by reflection waves from the load while supplying the maximum power to the load. The switch unit 101B, and matching circuits 102B, 103a, 103b, to 103n constitute a load matching circuit 105B.

In one specific example the control unit 170B generates a control signal S170B describing the frequency F1, F2 to Fn (where F1<F2<Fn) of the amplified signal S100. Based on this control signal S170B the switch unit 101B selects the signal path 171a, 171b to 171n corresponding to the frequency F1, F2 to Fn. In order to reduce insertion loss from the switch unit 101B, the matching circuit 102B sets the resistance component of the output impedance 162 sufficiently greater than the on impedance 163 and substantially constant relative to each frequency F1, F2 to Fn.

In another specific example the control unit 170B generates a control signal S170B denoting the power level P1, P2, to Pn (where P1<P2<Pn) of the amplified signal S100. Based on this control signal S170B the switch unit 101B selects the path 171a, 171b to 171n corresponding to the signal power P1, P2 to Pn.

In yet another specific example the control unit 170B generates a control signal S170B denoting n combinations of the frequency F1, F2 to Fi (where i is an integer of $1 \leq i \leq n$) and power level P1, P2 to Pj (where j is an integer of $1 \leq j \leq n$) of the amplified signal S100. Based on this control signal S170B the switch unit 101B selects the paths 171a, 171b to 171n corresponding to the n combinations of the frequency F1, F2 to Fi and power level P1, P2 to Pj.

This second embodiment of the invention has more output pins on the SPnT switch unit 101B and more matching circuits 103a, 103b, to 103n than the first embodiment. As a result, this embodiment can be rendered compatible with the desired number of bands and modes.

This second embodiment has one final stage amplification unit 100 and one matching circuit 102B, but could be rendered with N final stage amplification units 100 and N matching circuit 102B (where N is an integer of 2 or more), and the switch unit 101B could select one of the paths 171a, 171b to 171n for outputting the N impedance-converted signals S102 output from the N matching circuits 102B.

Embodiment 3

The third embodiment of the invention is described next with particular attention to the differences with the first embodiment. Other aspects of the arrangement, operation, and effect of this embodiment are the same as in the first embodiment, and further description thereof is omitted.

Figure 7A:
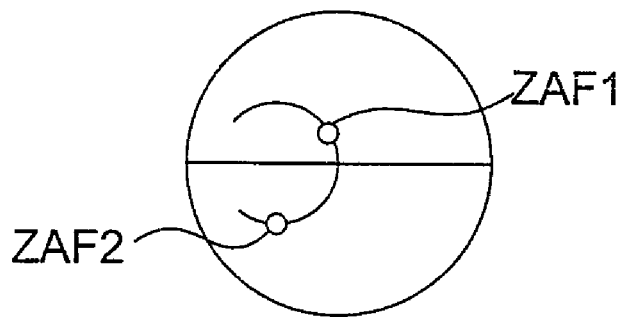
FIG. 7A describes the operation of the high frequency circuit according to the third embodiment of the invention.
Figure 7B:
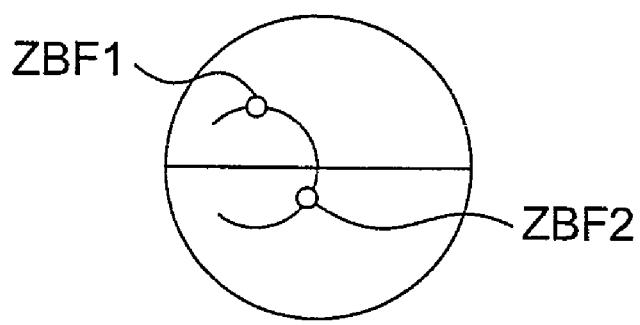
FIG. 7B describes the operation of the high frequency circuit according to the third embodiment of the invention.
Figure 7C:
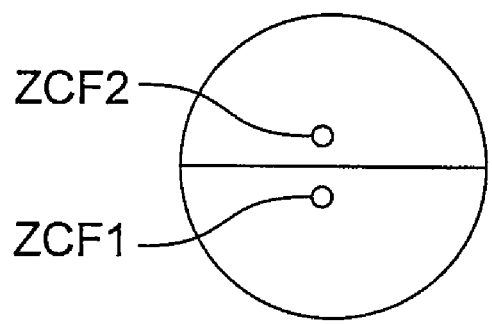
FIG. 7C describes the operation of the high frequency circuit according to the third embodiment of the invention.

FIG. 6 is a circuit diagram showing an example of the matching circuit 102A in a third embodiment of the invention. The high frequency circuit in this third embodiment is identical to the high frequency circuit of the first embodiment shown in FIG. 2. FIG. 7A, FIG. 7B, and FIG. 7C are Smith charts showing the input/output impedance of selected parts in FIG. 2 and FIG. 6.

As described in the first embodiment, the matching circuit 102A controls the output impedance 162 based on the control signal S170A. To reduce insertion loss from the switch unit 101A, the matching circuit 102A sets the resistance component of the output impedance 162 sufficiently greater than the on impedance 163 and substantially constant to frequency F1, F2.

More specifically, the amplified signal S100 is input to the matching circuit 102A, which generates an internal matching circuit signal S100Z by a shunt capacitor and passive device 120. The passive device 120 is a microstrip line or inductor.

The internal circuit 102A1 inside the matching circuit 102A has an input node 121 and an output node 122. A circuit having a capacitance C1, switch 107, and capacitance C2 connected in this order in series is parallel connected to a capacitance C3, and the ends of this parallel connection are respectively connected to the input node 121 and output node 122.

The internal matching circuit signal S100Z is input to the input node 121 of the internal circuit 102A1, which outputs impedance-converted signal S102 from the output node 122.

The switch 107 switches on/off based on the control signal S170 input to the control node 123 of the switch 107. When the switch unit 101A selects signal path 171a for frequency F1, the matching circuit 102A turns the switch 107 on. When the switch unit 101A selects signal path 171b for frequency F2, the matching circuit 102A turns the switch 107 off. The switch 107 thus changes the output impedance 162.

FIG. 7A and FIG. 7B show the output impedance 162 state. FIG. 7C shows the input impedance 164a, 164b at frequency F1, F2, respectively. Impedances ZAF1, ZBF1, ZCF1 correspond to frequency F1, and ZAF2, ZBF2, ZCF2 correspond to frequency F2. When the switch 107 is on, the impedance ZAF1 at frequency F1 is sufficiently high as shown in FIG. 7A. However, because the serial capacitance between the input/output pins of the internal circuit 102A1 is relatively large, the impedance ZAF2 to frequency F2 is low. Therefore, if switch 107 is off at frequency F2, the serial capacitance of the internal circuit 102A1 is relatively small, and the impedance ZBF2 to the frequency F2 is sufficiently high as shown in FIG. 7B. In FIG. 7C the impedances ZCF1, ZCF2 are in a complex conjugate relationship with impedances ZAF1, ZBF2.

Figure 10A:
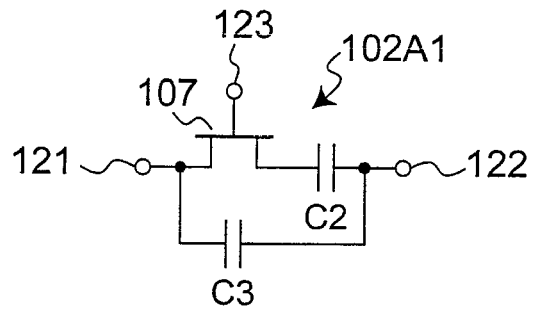
FIG. 10A is a circuit diagram showing an example of the matching circuit according to the third and fourth embodiments of the invention.

Variations of the internal circuit 102A1 shown in FIG. 6 are described next. FIG. 10A shows an arrangement in which the capacitance C1 connected to the input node 121 in the internal circuit 102A1 in FIG. 6 is omitted, and the switch 107 is connected directly to the input node 121.

Figure 10B:
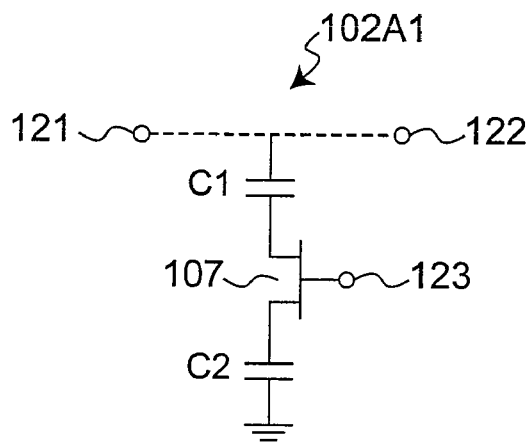
FIG. 10B is a circuit diagram showing an example of the matching circuit according to the third and fourth embodiments of the invention.

FIG. 10B shows an arrangement in which the capacitance C1, switch 107, and capacitance C2 are connected in a series circuit, the capacitance C1 end is inserted between the input node 121 and output node 122, and the capacitance C2 end is to ground. Some other circuit could additionally be inserted between the input node 121 and output node 122.

Figure 10C:
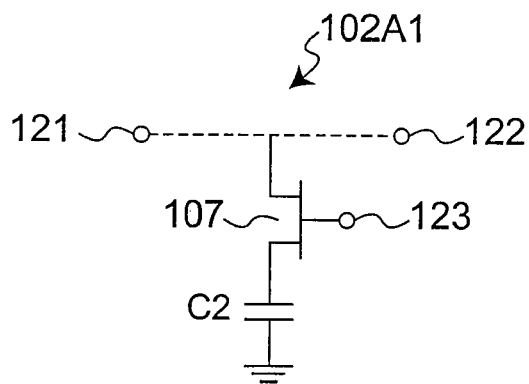
FIG. 10C is a circuit diagram showing an example of the matching circuit according to the third and fourth embodiments of the invention.

FIG. 10C shows an arrangement in which the capacitance C1 connected to the input node 121 in the internal circuit 102A1 in FIG. 10B is omitted, and the one side of the switch 107 is inserted directly between the input node 121 and output node 122.

The operation of the internal circuit 102A1 shown in FIG. 10A to FIG. 10C is as described above.

Figure 11:
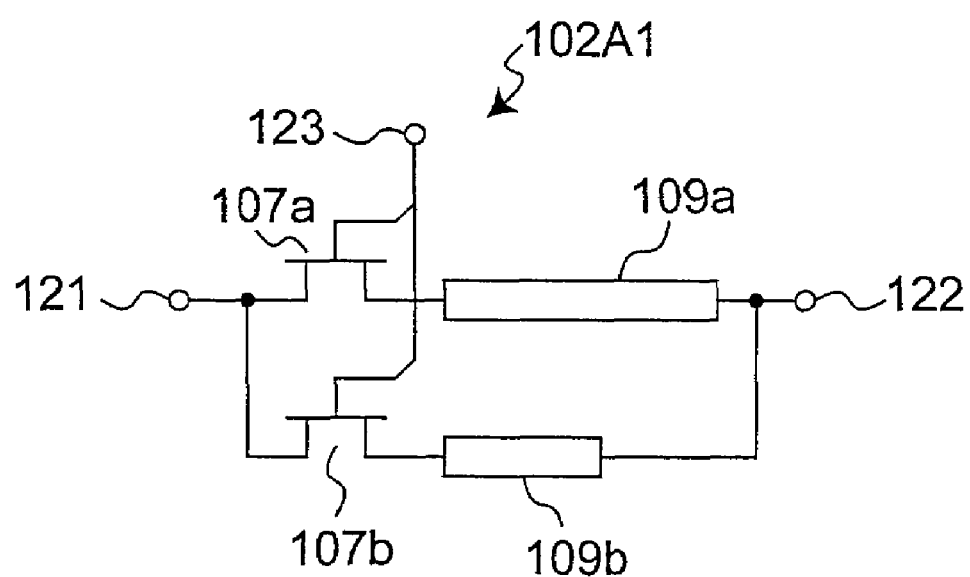
FIG. 11 is a circuit diagram of a matching circuit according to a fifth embodiment of the invention.

FIG. 11 shows a variation of a internal circuit 102A1 using microstrip lines. A series circuit including a switch 107a and microstrip line 109a, and a series circuit including a switch 107b and microstrip line 109b, are parallel connected, and nodes at the ends of the parallel circuits are connected to input node 121 and output node 122. The microstrip line 109a and 109b differ in the line length, and adjust the output impedance 162 based on the control signal S170 input to the control node 123. The internal circuit 102A1 using microstrip lines can be rendered by forming the switches 107a and 107b on a semiconductor chip, forming the microstrip lines 109a and 109b on a circuit board module on which the semiconductor chips are mounted, and connecting them with wires. The internal circuit 102A1 shown in FIG. 11 can also be rendered by replacing the microstrip lines 109a and 109b with two inductors of different inductance.

The internal circuit 102A1 can also be rendered by replacing at least one of the capacitances C1, C2, C3 with an inductor or microstrip line in the circuits shown in FIG. 6 and FIG. 10A to FIG. 10C.

The internal circuit 102A1 could also be rendered as a hybrid circuit composed of a suitable combination of the circuits shown in FIG. 6, FIG. 10A to FIG. 10C, and FIG. 11 and these circuits in which at least one of the capacitances C1, C2, C3 is replaced with an inductor or microstrip line. In the circuits rendering this hybrid circuit, the capacitances C1, C2, C3, inductors, and microstrip lines can be different sizes.

The matching circuit 102A in this third embodiment of the invention is rendered as shown in FIG. 6, FIG. 10A to FIG. 10C, and FIG. 11 to turn the switch 107 on/off. As a result, the resistance component of the output impedance 162 is sufficiently greater than the on impedance 163 and substantially constant at each frequency F1, F2. Insertion loss from the switch unit 101A is also sufficiently reduced. This is effective when the frequencies F1 and F2 are several 10 MHz apart, and even more effective when 100 MHz apart. The design of the control unit 170 is simplified by linking selection of the paths 171*a* and 171*b* by the switch unit 101A to the on/off state of the switch 107 in the matching circuit 102A.

Embodiment 4

The fourth embodiment of the invention is described next with particular attention to the differences with the second and third embodiments. Other aspects of the arrangement, operation, and effect of this embodiment are the same as in the second and third embodiments, and further description thereof is omitted.

Figure 9A:
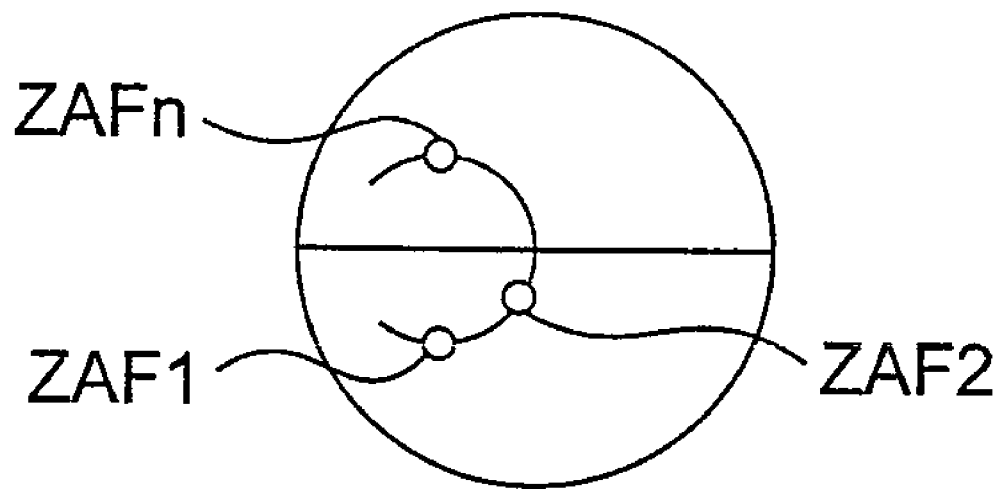
FIG. 9A describes the operation of the high frequency circuit according to the fourth embodiment of the invention.
Figure 9B:
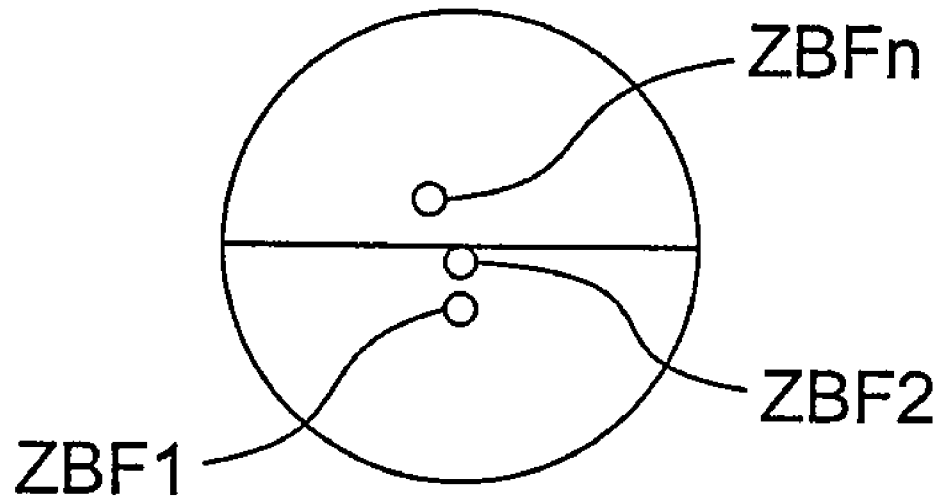
FIG. 9B describes the operation of the high frequency circuit according to the fourth embodiment of the invention.

FIG. 8 is a circuit diagram showing an example of the matching circuit 102B in a fourth embodiment of the invention. The high frequency circuit in this embodiment is identical to the high frequency circuit of the second embodiment shown in FIG. 5. FIG. 9A and FIG. 9B are Smith charts showing the input/output impedance of selected parts in FIG. 5 and FIG. 8.

As described in the second embodiment, the matching circuit 102B controls the output impedance 162 based on the control signal S170B. To reduce insertion loss from the switch unit 101B, the matching circuit 102B sets the resistance component of the output impedance 162 sufficiently greater than the on impedance 163 and substantially constant to frequency F1, F2 to Fn.

More specifically, the amplified signal S100 is input to the matching circuit 102B, which generates an internal matching circuit signal S100Z by a shunt capacitor and passive device 120. The passive device 120 is a microstrip line or inductor.

The internal circuit 102B1 of the matching circuit 102B has an input node 121 and an output node 122. The internal circuit 102B1 includes n parallel circuits, including a series circuit having a capacitance C1, a switch 107*a*, and a capacitance C2 connected in order, m−1 identical series circuits replacing switch 107*a* with a switch 107*b* to 107*m* (where m =n−1), and a capacitance C3 parallel connected to the series circuits with the ends of the parallel circuits respectively connected to the input node 121 and output node 122. In the m series circuits having capacitance C1 and capacitance C2, capacitances C1 and C2 can be different from each other.

The internal matching circuit signal S100Z is input to the input node 121 of the internal circuit 102B1, which outputs impedance-converted signal S102 from the output node 122.

The switches 107*a* to 107*m* switch on/off based on the m control signals S170 input to the control nodes 123 of the switches 107*a* to 107*m*.

When the switch unit 101B selects signal path 171*a* for frequency F1, the matching circuit 102B turns all switches 107*a* to 107*m* (where m=n−1) on. When the switch unit 101B selects signal path 171*b* for frequency F2, the matching circuit 102B turns only switch 107*a* off. Likewise, when the switch unit 101B selects signal path 171*n* for frequency Fn, the matching circuit 102B turns all switches 107*a* to 107*m* off. As a result, the serial capacitance between the input/output pins of the internal circuit 102B1 decreases sequentially from frequency F1 to frequency F2 to frequency Fn. The output impedance S102 thus increases independently of the frequency.

FIG. 9A shows the impedance state when frequency F2 is selected and only switch 107*a* is off. Impedance ZAF2 is sufficiently high but impedance drops at frequencies other than frequency F2. This shows that it is difficult to keep impedance high irrespective of frequency using the same passive circuit. However, by using switches 107*a* to 107*m*, the output impedance S102 changes as indicated by impedance ZBF1, ZBF2, to ZBFn for frequency F1, F2, to Fn, and is substantially constant as shown in FIG. 9B.

A variation of the matching circuit 102B shown in FIG. 8 is described next.

Figure 10D:
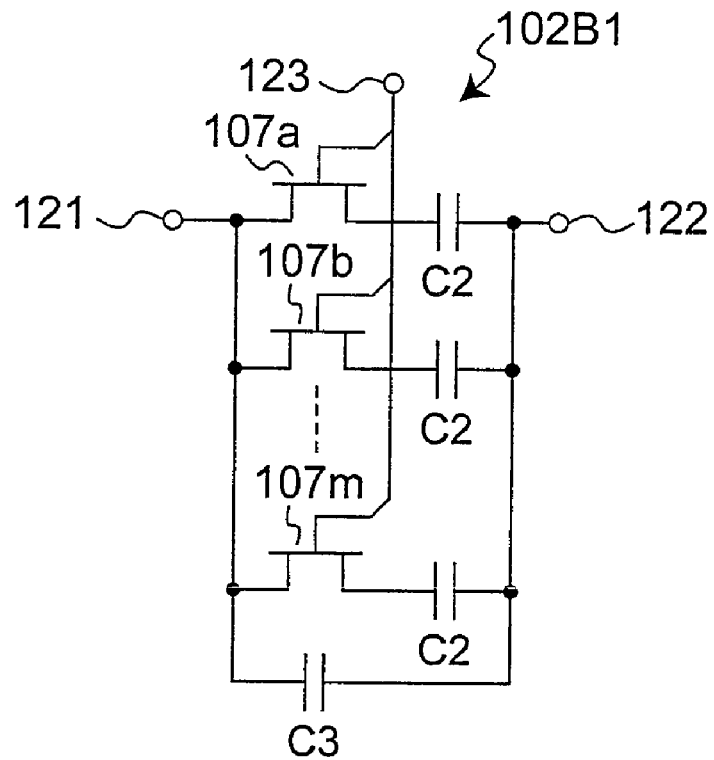
FIG. 10D is a circuit diagram showing an example of the matching circuit according to the third and fourth embodiments of the invention.

FIG. 10D shows an arrangement in which all of the capacitances C1 connected to the input node 121 in the internal circuit 102B1 in FIG. 8 are omitted, and the switches 107*a* to 107*m* are connected directly to the input node 121.

Figure 10E:
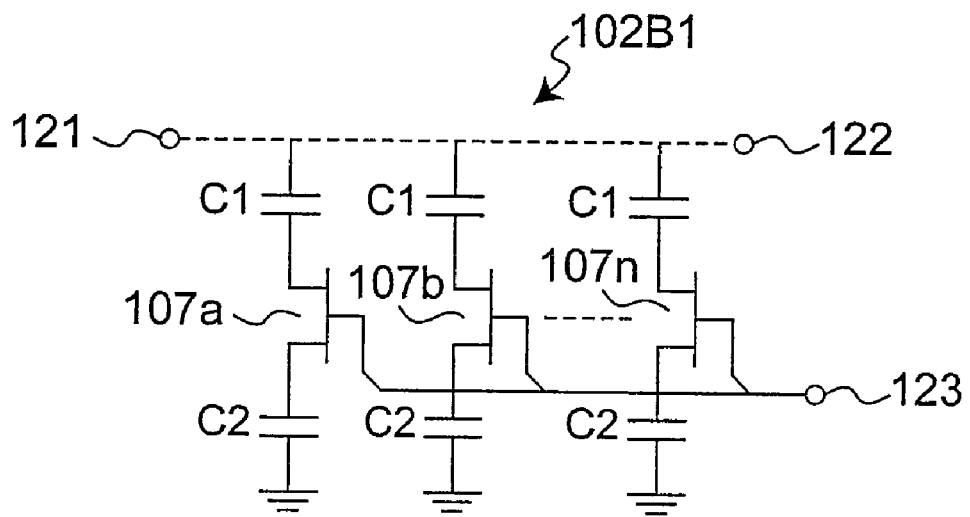
FIG. 10E is a circuit diagram showing an example of the matching circuit according to the third and fourth embodiments of the invention.

FIG. 10E shows an arrangement having a series circuit including a capacitance C1, a switch 107*a*, and a capacitance C2, and n−1 identical series circuits in which switch 107*a* is replaced by a switch 107*b* to 107*n* parallel connected to the first series circuit. The capacitance C1 end of each parallel circuit is connected between the input node 121 and output node 122, and the capacitance C2 end of each circuit is to ground. Some other circuit could additionally be inserted between the input node 121 and output node 122.

Figure 10F:
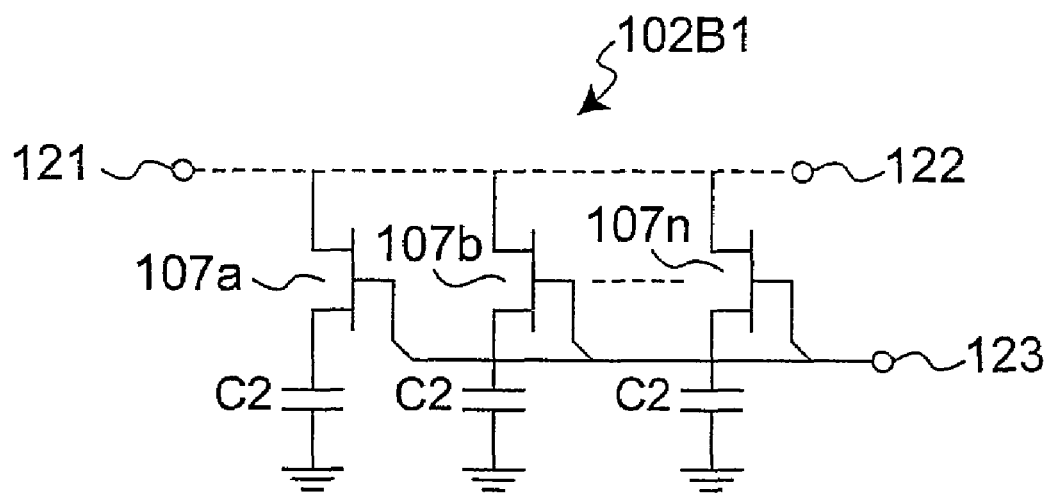
FIG. 10F is a circuit diagram showing an example of the matching circuit according to the third and fourth embodiments of the invention.

FIG. 10F shows an arrangement in which all capacitances C1 connected to the input node 121 in the internal circuit 102B1 in FIG. 10E are omitted, and one side of the switches 107*a* to 107*n* is inserted directly between the input node 121 and output node 122.

Figure 10G:
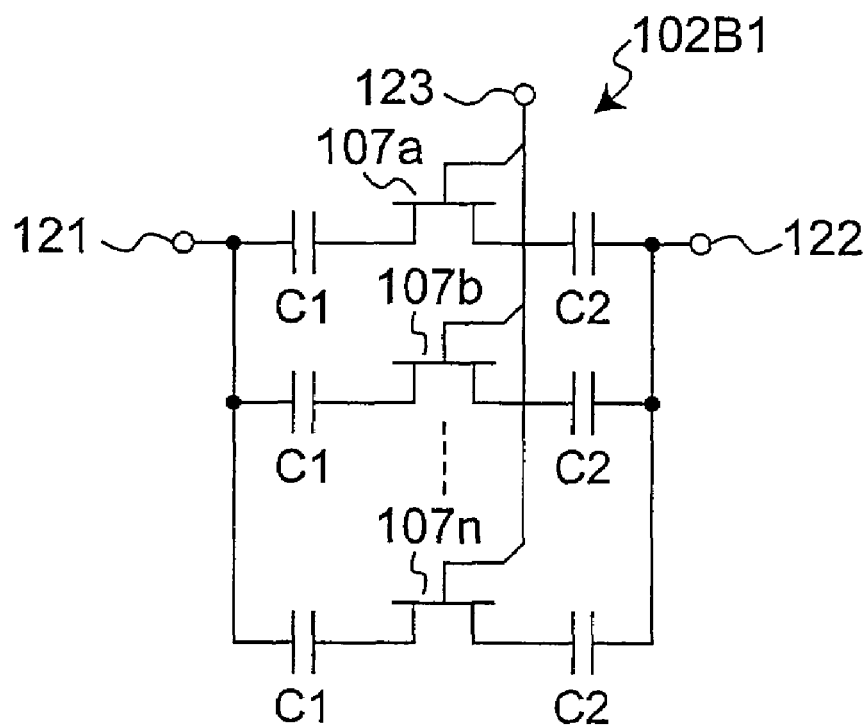
FIG. 10G is a circuit diagram showing an example of the matching circuit according to the third and fourth embodiments of the invention.

FIG. 10G shows a variation of the internal circuit 102B1 in FIG. 8 in which the capacitance C3 is omitted and there are n series circuits including a capacitance C1, a switch, and a capacitance C2.

Figure 10H:
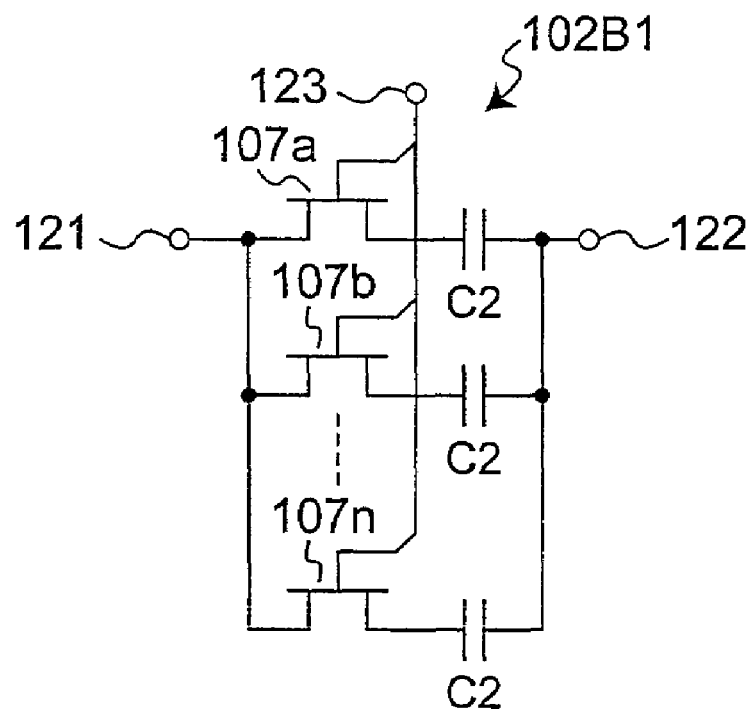
FIG. 10H is a circuit diagram showing an example of the matching circuit according to the third and fourth embodiments of the invention.

FIG. 10H shows a variation of the arrangement in FIG. 10G in which all capacitances C1 connected to the input node 121 are omitted, and the switches 107*a* to 107*n* are directly connected to the input node 121.

The capacitances C1 and C2 can be different in each of the m or n circuits having at least one capacitance C1 or C2 in the arrangements shown in FIG. 10D to FIG. 10H.

The operation of the internal circuit 102B1 shown in FIG. 10D to FIG. 10H is as described above.

The internal circuit 102B1 can also be rendered by replacing at least one of the capacitances C1, C2, C3 with an inductor or microstrip line in the circuits shown in FIG. 8 and FIG. 10D to FIG. 10H.

The internal circuit 102B1 could also be rendered as a hybrid circuit composed of a suitable combination of the circuits shown in FIG. 8 and FIG. 10D to FIG. 10H and these circuits in which at least one of the capacitances C1, C2, C3 is replaced with an inductor or microstrip line. In the circuits rendering this hybrid circuit, the capacitances C1, C2, C3, inductors, and microstrip lines can be different sizes.

The matching circuit 102B in this fourth embodiment of the invention is rendered as shown in FIG. 8 to turn the switches 107*a* to 107*m* on/off. As a result, the resistance component of the output impedance 162 is sufficiently greater than the on impedance 163 and substantially constant at each frequency F1, F2 to Fn. Insertion loss from the switch unit 101A is also sufficiently reduced.

Part of the m capacitances connected to the switches 107*a* to 107m in the internal circuit 102B1 shown in FIG. 8 can differ from the other capacitances. The m switches 107*a* to 107*m* can also be replaced by k (where 3≦k<m) switches 107*a* to 107*k*. In this case the k switches 107*a* to 107*k* are arranged so that the switches can be appropriately turned on/off in different combinations to produce n capacitances in the internal circuit 102B1.

Embodiment 5

The fifth embodiment of the invention is described next with particular attention to the differences with the first to fourth embodiments. Other aspects of the arrangement, operation, and effect of this embodiment are the same as in the second and third embodiments, and further description thereof is omitted.

Figure 12A:
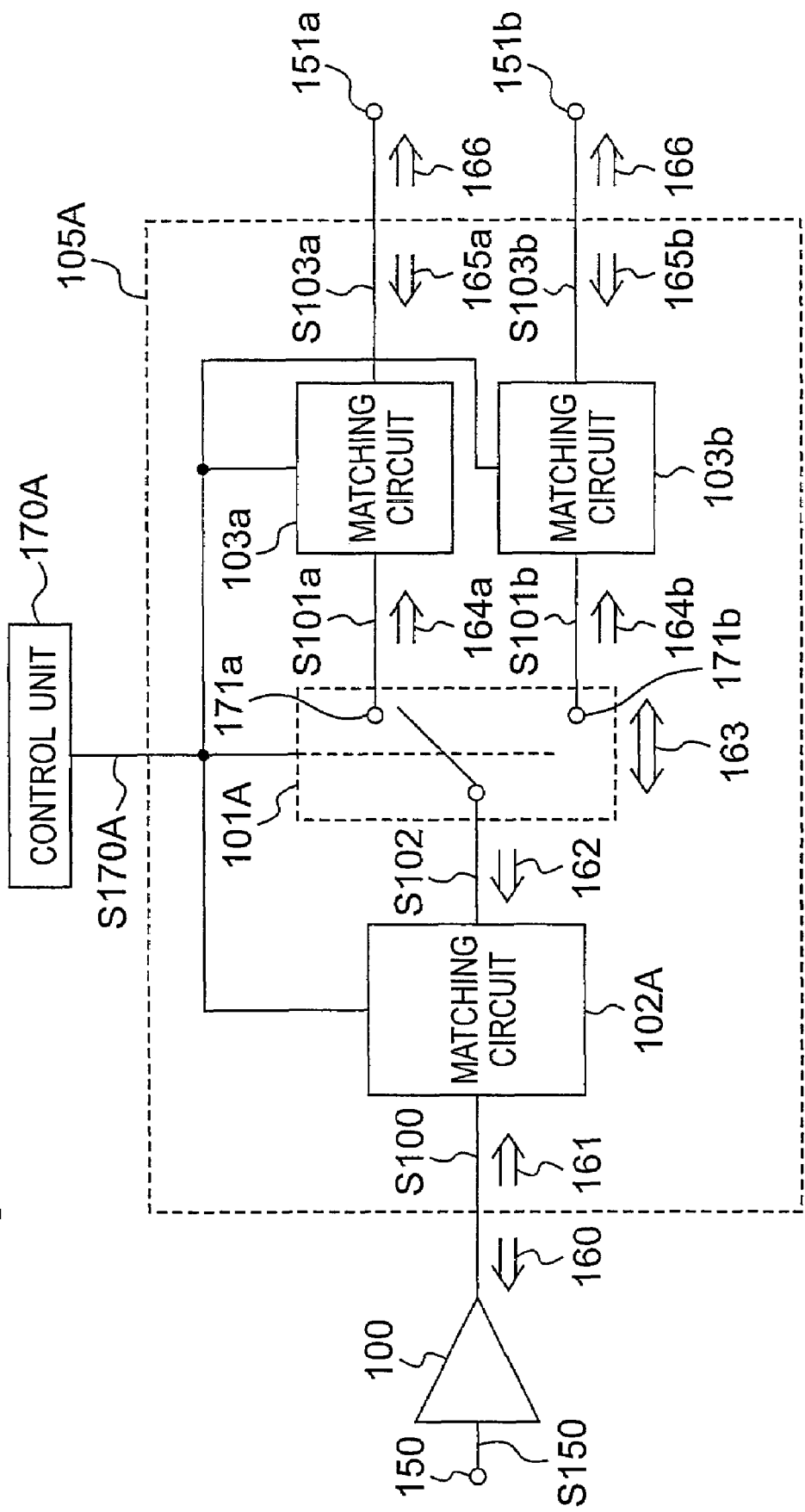
FIG. 12A is a block diagram of a high frequency circuit according to the fifth embodiment of the invention.
Figure 12B:
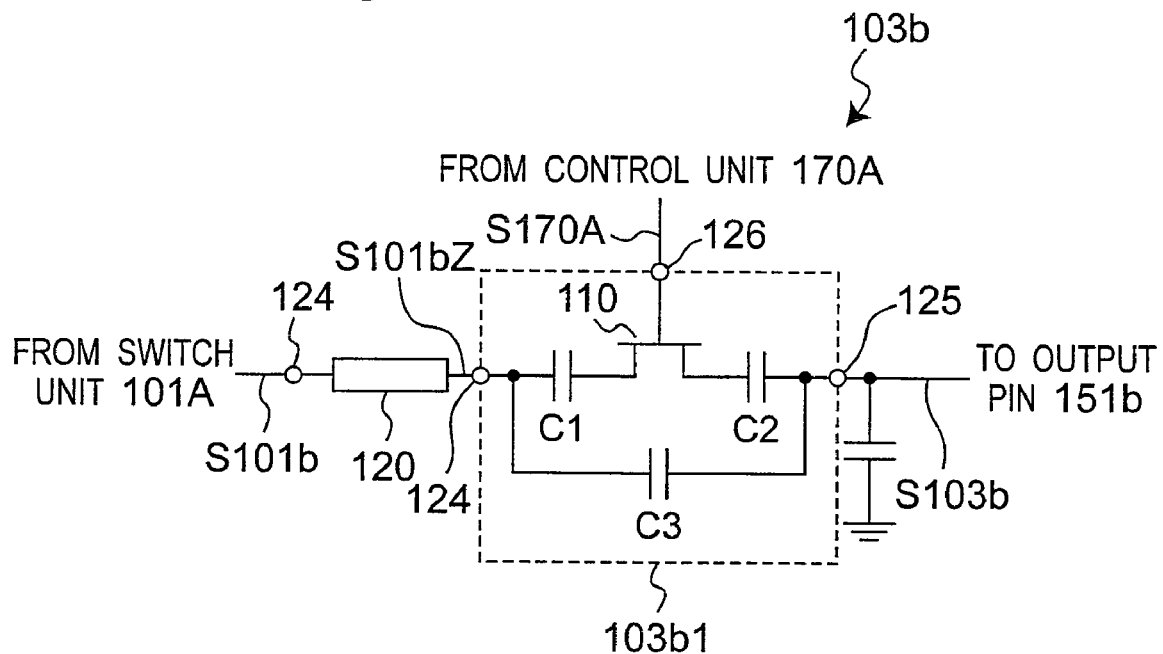
FIG. 12B s a circuit diagram of a matching circuit according to a fifth embodiment of the invention.
Figure 12C:
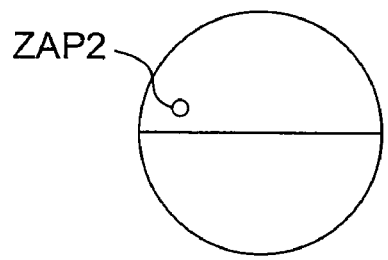
FIG. 12C describes the operation of the high frequency circuit according to the fifth embodiment of the invention.

FIG. 12A is a block diagram of a high frequency circuit according to the fifth embodiment of the invention. FIG. 12B is a circuit diagram of the matching circuit 103b in the fifth embodiment of the invention. FIG. 12C is a Smith chart describing the operation of the high frequency circuit according to the fifth embodiment of the invention.

As shown in FIG. 12B, a pass signal S101b is input to the matching circuit 103b, which generates an internal matching circuit signal S101bZ by a passive device 120. The passive device 120 is a microstrip line or inductor.

The internal circuit 103b1 of the matching circuit 103b has an input node 124 and an output node 125. The internal circuit 103b1 includes a series circuit having a capacitance C1, a switch 110, and a capacitance C2 connected in order, and a capacitance C3 parallel connected to the series circuit with the ends of the parallel circuits respectively connected to the input node 124 and output node 125.

The internal matching circuit signal S101bZ is input to the input node 124 of the internal circuit 103b1, which outputs impedance-converted signal S103b from the output node 125.

The switch 110 switches on/off based on the control signal S170A input to the control node 126 of the switch 110.

In FIG. 12A the control unit 170A generates a control signal S170A describing the frequency and signal power of the amplified signal S100. The switch unit 101A selects path 171a or path 171b based on the frequency F1, F2 of the amplified signal S100. The matching circuit 103a operates at frequency F1 and the matching circuit 103b operates at frequency F2. For example, at frequency F1 the matching circuit 103a sets the output power of the amplified signal S100 to P1 based on the control signal S170A. At frequency F2, the matching circuit 103b turns the switch 110 off when the power of the amplified signal S100 is P2, and turns switch 110 on if the power of the amplified signal S100 is P3, which is less than P2. As a result, when the power is P3, the input impedance 164b of the matching circuit 103b is higher than when the power is P2.

Figure 12D:
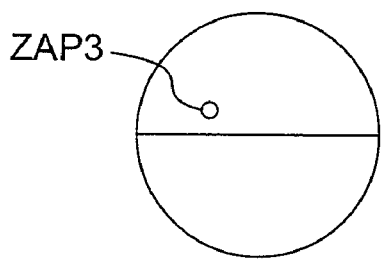
FIG. 12D describes the operation of the high frequency circuit according to the fifth embodiment of the invention.

FIG. 12C and FIG. 12D are Smith charts showing the input impedance 161 of the matching circuit 102A in this fifth embodiment of the invention. In FIG. 12C the impedance ZAP2 indicates the input impedance 161 at power P2. In FIG. 12D, impedance ZAP3 indicates the input impedance 161 at power P3. Because the input impedance 164b of the matching circuit 103b rises, impedance ZAP3 is greater than impedance ZAP2.

By rendering the matching circuit 103b as shown in FIG. 12B in this fifth embodiment of the invention, the switch 110 is controlled according to the power of the amplified signal S100 to change the input impedance 164b of the matching circuit 103b. The input impedance 161 can thus be optimally adjusted according to the power, and the power efficiency of the final stage amplification unit 100 can be increased. In addition, the input impedance 161 can be optimized according to the frequency by using the switch unit 101A to enable the matching circuits 103a and 103b according to the frequency. This fifth embodiment of the invention can thus maximize power efficiency for both frequency and power.

The matching circuit 103b adjusts the input impedance 164b according to the strength of the amplified signal S100, and the strength of the amplified signal S100 can be expressed as either average power or peak power.

FIG. 12B shows the arrangement of the matching circuit 103b, but the matching circuit 103a could be arranged this way instead, or both matching circuit 103a and matching circuit 103b can be arranged this way.

Furthermore, in the second embodiment shown in FIG. 5 any one of the matching circuit 103a to 103n can be arranged as shown in FIG. 12B.

Yet further, the arrangement in FIG. 12B maximizes power efficiency according to the magnitude of the amplified signal S100, but could alternatively be used to minimize the distortion characteristic according to the magnitude of the amplified signal S100. An arrangement for maximizing power efficiency and an arrangement for minimizing distortion could also be selectively enabled according to the application. In this case at least one of capacitances C1, C2, and C3 is switched in both arrangements.

As described in the fourth embodiment, the matching circuit 103b shown in FIG. 12B can be modified in the same way as the internal circuits 102B1 shown in FIG. 8 and FIG. 10D to FIG. 10H, and can be further modified by replacing at least a part of the capacitances C1, C2, C3 with an inductor or microstrip line.

The internal circuit 102B1 could also be rendered as a hybrid circuit composed of a suitable combination of the circuits shown in FIG. 8, FIG. 10D to FIG. 10H, and FIG. 11 and these circuits in which at least one of the capacitances C1, C2, C3 is replaced with an inductor or microstrip line. In the circuits rendering this hybrid circuit, the capacitances C1, C2, C3, inductors, and microstrip lines can be different sizes.

In the circuits rendering this hybrid circuit, the capacitances C1, C2, C3, inductors, and microstrip lines can be different sizes. Circuits rendered with microstrip lines as shown in FIG. 11 can also be mounted as described in the third embodiment.

Embodiment 6

The sixth embodiment of the invention is described next with particular attention to the differences with the fifth embodiment. Other aspects of the arrangement, operation, and effect of this embodiment are the same as in the fifth embodiment, and further description thereof is omitted.

Figure 13A:
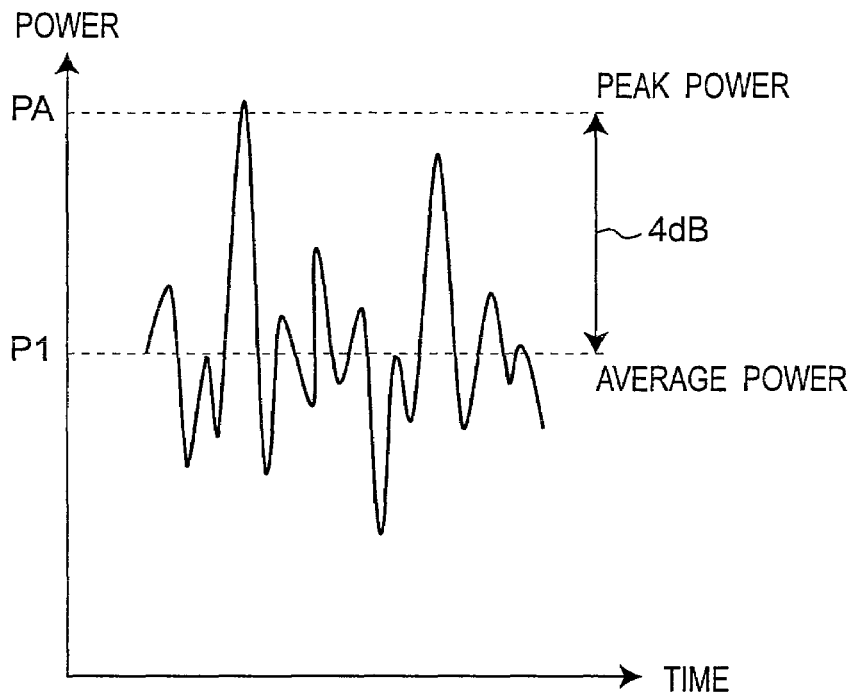
FIG. 13A is a waveform diagram showing the operating signal of the high frequency circuit according to a sixth embodiment of the invention.
Figure 13B:
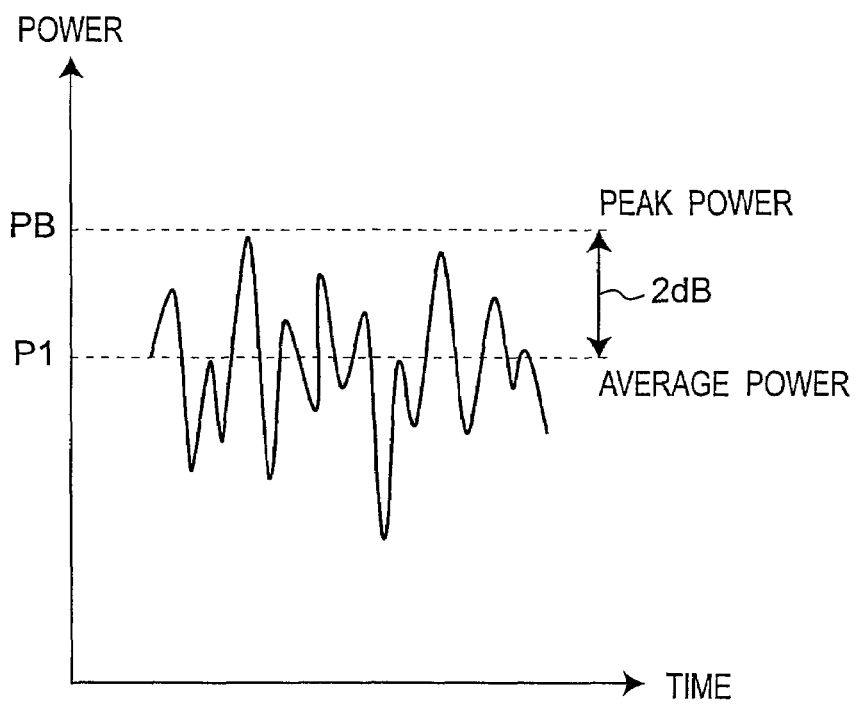
FIG. 13B is a waveform diagram showing the operating signal of the high frequency circuit according to a sixth embodiment of the invention.

FIG. 13A and FIG. 13B are waveform diagrams showing the change in the magnitude of the amplified signal S100 in a period of time. When the amplified signal S100 is a CDMA (code division multiple access), OFDM (orthogonal frequency division multiplexing), or similarly modulated signal, the amplitude of the amplified signal S100 changes in a period of time. In FIG. 13A the peak power PA of the amplified signal S100 is approximately 4 dB higher than the average power P1, and in FIG. 13B the peak power PB of the amplified signal S100 is approximately 2 dB higher than the average power P1.

If amplified signal S100 distortion can be decreased when processing a variable amplitude modulation signal, the quality of the SNR of the impedance-converted signal S103 output to the antenna can be improved and crosstalk can be reduced. To do this the final stage amplification unit 100 must linearly amplify the input signal S150 to peak power. However, the power efficiency of the final stage amplification unit 100 drops if the final stage amplification unit 100 is designed to linearly amplify the input signal to peak power PA as shown in FIG. 13A, even when the signal is only used to peak power PB as shown in FIG. 13B.

Figure 14A:
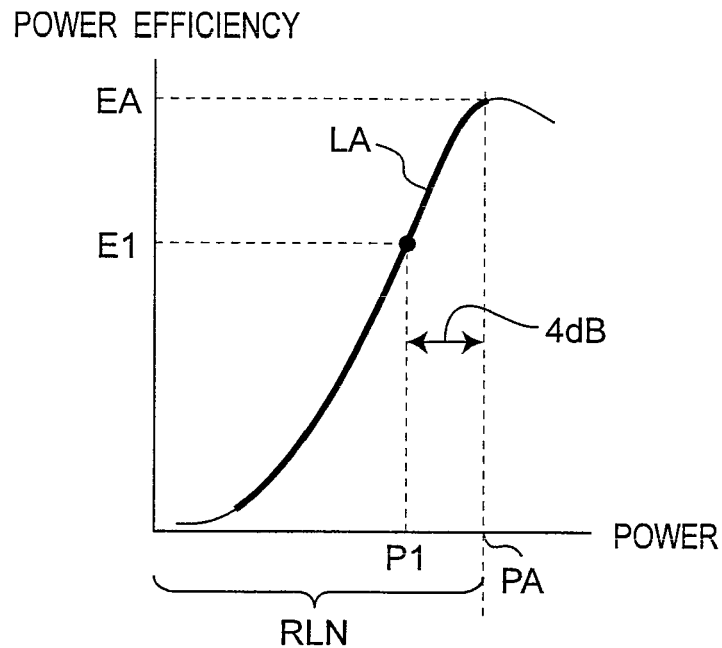
FIG. 14A is a graph showing the operating characteristic of the high frequency circuit according to a sixth embodiment of the invention.
Figure 14B:
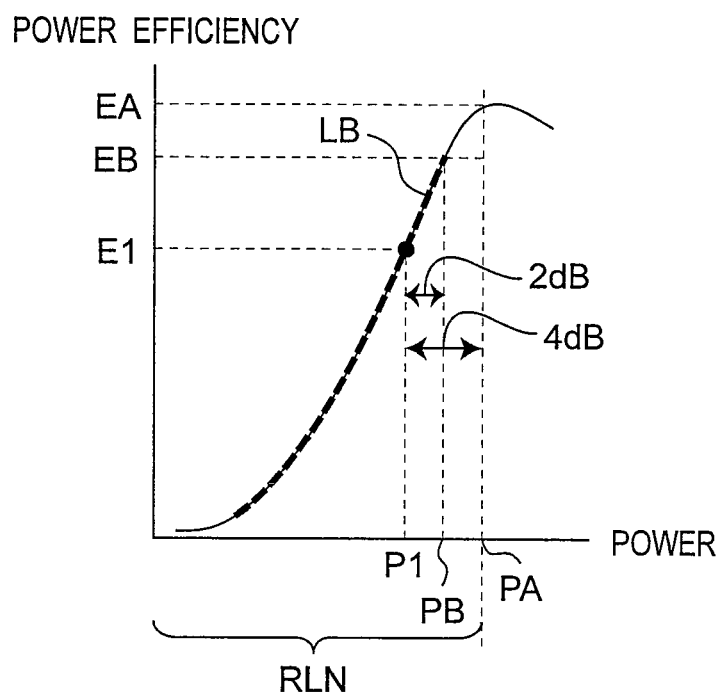
FIG. 14B is a graph showing the operating characteristic of the high frequency circuit according to a sixth embodiment of the invention.

FIG. 14A and FIG. 14B show the power efficiency of the same final stage amplification unit 100 when generating the amplified signal S100 shown in FIG. 13A and FIG. 13B.

In FIG. 14A the operating curve LA indicated by the bold line is characterized by average power P1 and peak power PA, which corresponds to the maximum output power in the linear operating range RLN of the final stage amplification unit 100. The power efficiency at average power P1 is E1, and the peak power efficiency at peak power PA is EA.

In FIG. 14B the operating curve LB indicated by the bold dotted line is characterized by average power P1 and peak power PB, which is lower than peak power PA. The power efficiency at average power P1 is E1, and the peak power efficiency at peak power PB is EB, which is less than EA. The final stage amplification unit 100 operating state represented by the operating curve LA is called the high peak power mode, and the operating state represented by operating curve LB is called the low peak power mode.

Figure 14C:
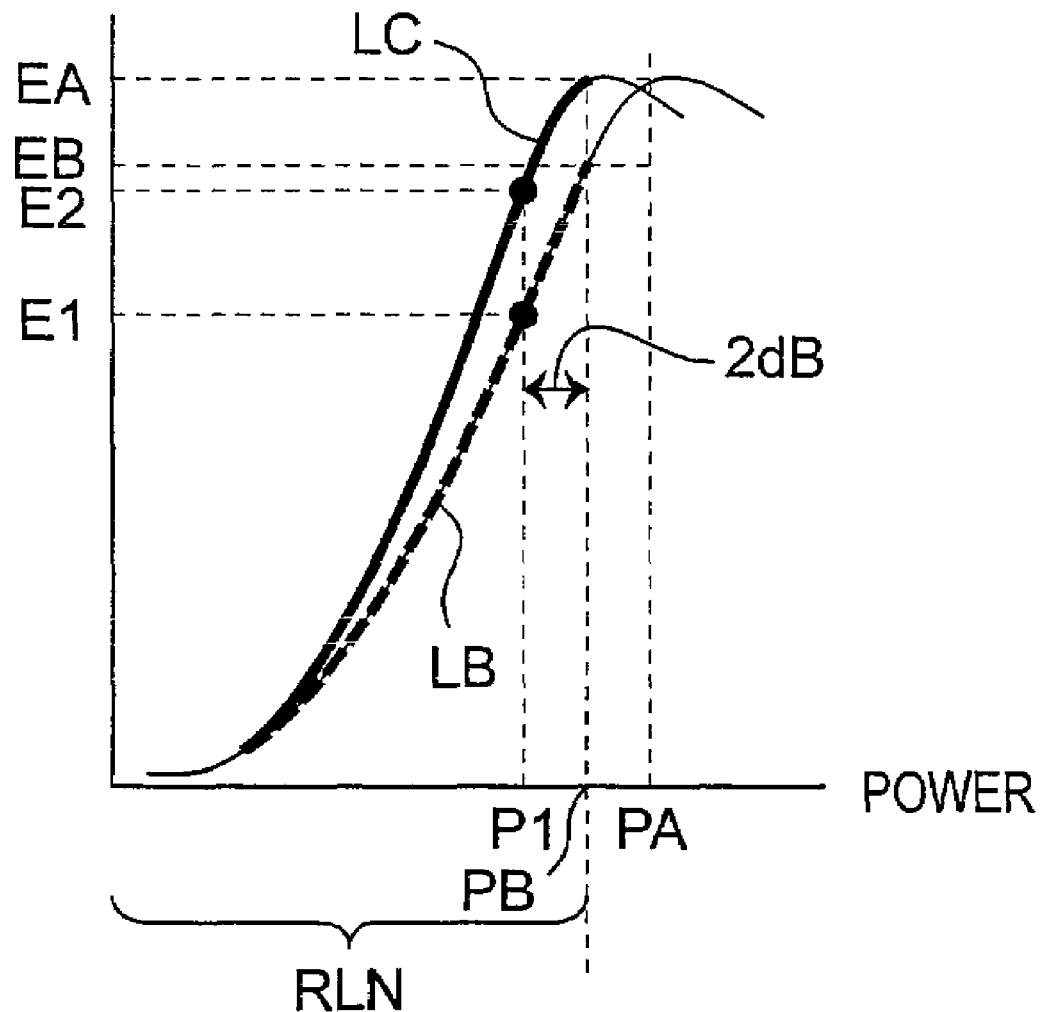
FIG. 14C is a graph showing the operating characteristic of the high frequency circuit according to a sixth embodiment of the invention.

Because peak power efficiency EB is lower than EA on operating curve LB, average power efficiency E1 is equal to the average power efficiency E1 on operating curve LA even though the peak power PB of the amplified signal S100 is low. If the linear operating range RLN is lowered from peak power PA or less to peak power PB or less and the peak power efficiency at peak power PB is EA as shown by the operating curve LC denoted by the solid bold line in FIG. 14C, the peak power efficiency at average power P1 goes from E1 to a higher E2, and the final stage amplification unit 100 can be operated with higher efficiency.

The linear operating range RLN of the final stage amplification unit 100 can be changed by the input impedance 161. In the fifth embodiment of the invention switch 110 is used to change the input impedance 164b of the matching circuit 103b to optimize the input impedance 161 for the average power. The switch 110 can be similarly used to change the input impedance 164b of the matching circuit 103b, optimize the input impedance 161 based on peak power PA and PB, and increase the power efficiency of the final stage amplification unit 100.

More specifically, when the arrangement shown in FIG. 12B is operating in the high peak power mode outputting peak power PA, switch 110 is off so that the input impedance 161 decreases. When operating in a low peak power mode outputting peak power PB, the switch 110 is on to increase the input impedance 161.

This sixth embodiment of the invention switches the switch 110 in the arrangement described in the fifth embodiment to change the input impedance 164b of the matching circuit 103b according to the peak power of the selected operating mode. As a result, the input impedance 161 is optimized for the peak output power of the selected operating mode, and the power efficiency of the final stage amplification unit 100 can be maximized. This sixth embodiment of the invention can be beneficially used for data communications, for example, where the peak power may be changed to increase the transmission rate using the same modulation method.

The switch that switches according to the peak power of the operation mode can be the switch 107 or the switches 107a to 107m of the matching circuit 102 described according to the third or fourth embodiments above. The switch unit 101A or switch unit 101B of the first or second embodiment could also be used.

Embodiment 7

The seventh embodiment of the invention is described next with particular attention to the differences with the fifth and sixth embodiments. Other aspects of the arrangement, operation, and effect of this embodiment are the same as in the fifth and sixth embodiments, and further description thereof is omitted.

Figure 15:
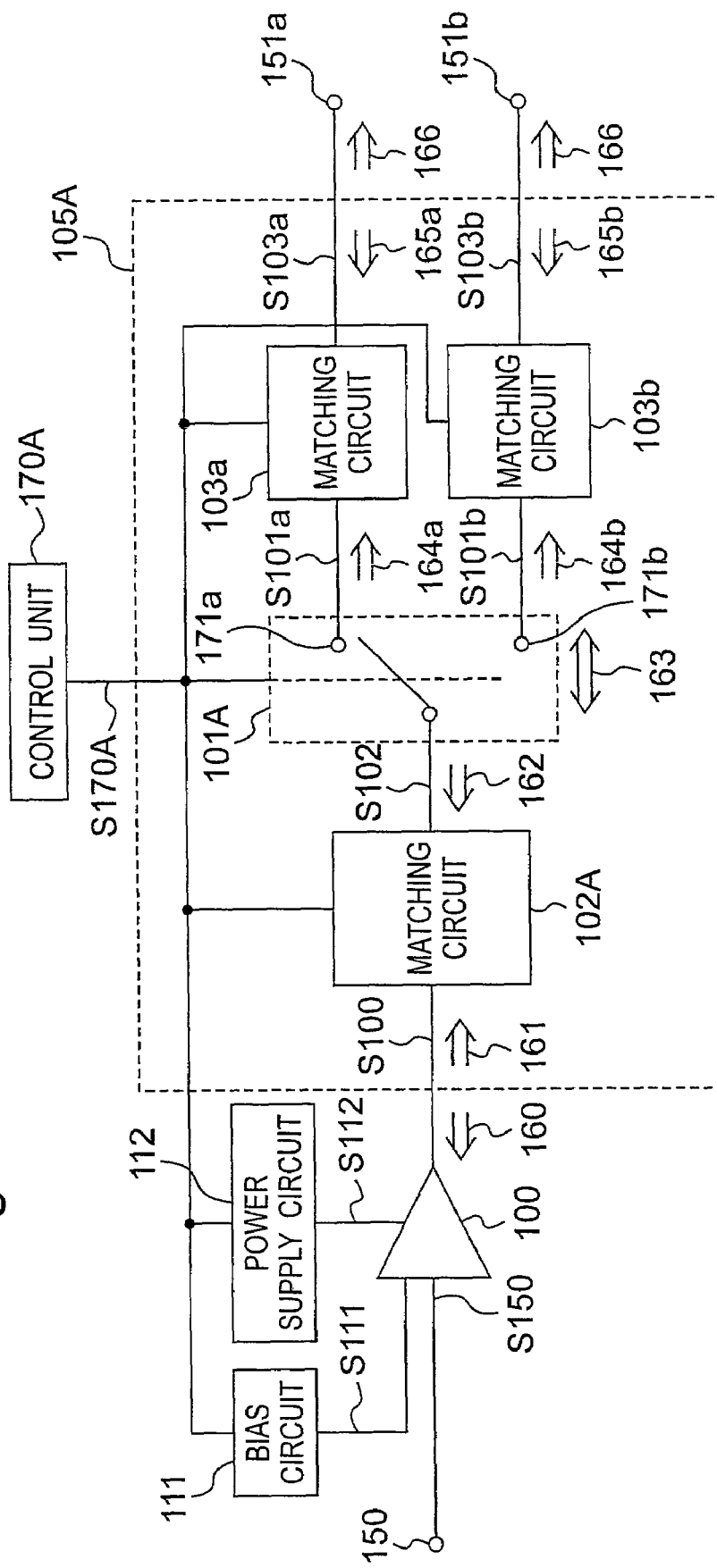
FIG. 15 is a block diagram of a high frequency circuit according to a seventh embodiment of the invention.

FIG. 15 is a block diagram of a high frequency circuit according to a seventh embodiment of the invention. The high frequency circuit according to this embodiment of the invention is the high frequency circuit shown in FIG. 12A according to the fifth embodiment with the addition of a bias circuit 111 and power supply circuit 112.

Based on the control signal S170A, the bias circuit 111 supplies a bias output signal S111 denoting the bias current at the input pin to the final stage amplification unit 100 or the bias voltage between the input and common nodes. Based on the control signal S170A, the power supply circuit 112 supplies supply voltage S112 to the final stage amplification unit 100. If the final stage amplification unit 100 is a multistage amplifier, the bias circuit 111 and power supply circuit 112 supply the bias output signal S111 and supply voltage S112 to at least one amplification stage.

As described in the fifth and sixth embodiments, this seventh embodiment optimizes the input impedance 161 according to the average power or the peak power of the amplified signal S100. The bias output signal S111 and the supply voltage S112 of the final stage amplification unit 100 are also adjusted in conjunction with optimizing the input impedance 161. By thus optimizing the input impedance 161 and the bias output signal S111 and supply voltage S112, power efficiency is further improved and distortion is further reduced.

The final stage amplification unit 100 is a bipolar transistor that has at least two different emitter areas, and the emitter area can be changed based on the control signal. The final stage amplification unit 100 could also be rendered using a field-effect transistor having at least two different gate widths, and the gate width can be changed according to the control signal. By thus optimizing the input impedance 161 while also optimizing the emitter area or gate width, power efficiency can be further improved and distortion can be further reduced.

Embodiment 8

The eighth embodiment of the invention is described next with particular attention to the differences with the first to seventh embodiments. Other aspects of the arrangement, operation, and effect of this embodiment are the same as in the first to seventh embodiments, and further description thereof is omitted.

This eighth embodiment describes the scope of the circuits rendered on a semiconductor chip in the first to seventh embodiments.

In the second embodiment shown in FIG. 5, at least a part of the switch unit 101B and the matching circuits 102B, and 103a, 103b to 103n that constitute the load matching circuit 105B are rendered on the single semiconductor chip of the eighth embodiment. The final stage amplification unit 100 could also be rendered on the semiconductor chip of the eighth embodiment. If the internal circuit 102B1 shown in FIG. 8 or the switch 110 shown in FIG. 12B is included in the matching circuits 102B, and 103a, 103b to 103n, at least a part of these switches is included in the semiconductor chip of the eighth embodiment.

These switches are rendered using field-effect transistors (FET). The switches could also be rendered using high electron mobility transistors (HEMT), in which case the on resistance per chip area is less than with a FET, signal pass loss is less, and the chip area can be reduced.

If the capacitance devices or inductance devices used in the matching circuits 102B and 103a, 103b to 103n are also formed on the semiconductor chip of the eighth embodiment, a multifunction, high performance switch circuit can be rendered in a highly integrated semiconductor chip with a small footprint, and a small, multifunctional high frequency circuit can be rendered to great effect.

The overall arrangement of the high frequency circuit can also be simplified by rendering the control unit 170B, bias circuit 111, and power supply circuit 112 on the semiconductor chip of the eighth embodiment.

The semiconductor chip of the eight embodiment and the matching circuits 102B, and 103a, 103b to 103n that are not rendered on the semiconductor chip can also be formed or mounted on a resin or ceramic substrate. The microstrip lines of the matching circuits 102B, and 103a, 103b to 103n are rendered on the substrate while the inductors and capacitances are mounted as chips. In this case the final stage amplification unit 100 can be included or not included in the semiconductor chip. If the final stage amplification unit 100 is not included in the semiconductor chip, the final stage amplification unit 100 is mounted as a discrete chip on the substrate.

By thus rendering the switch unit 101B and matching circuits 102B, and 103a, 103b to 103n on a semiconductor chip according to the eighth embodiment of the invention, the size and cost of the high frequency circuit and the high frequency power amplifier can be reduced.

Embodiment 9

The ninth embodiment of the invention is described next with particular attention to the differences with the first to eighth embodiments. Other aspects of the arrangement, operation, and effect of this embodiment are the same as in the first to eighth embodiments, and further description thereof is omitted.

Figure 16:
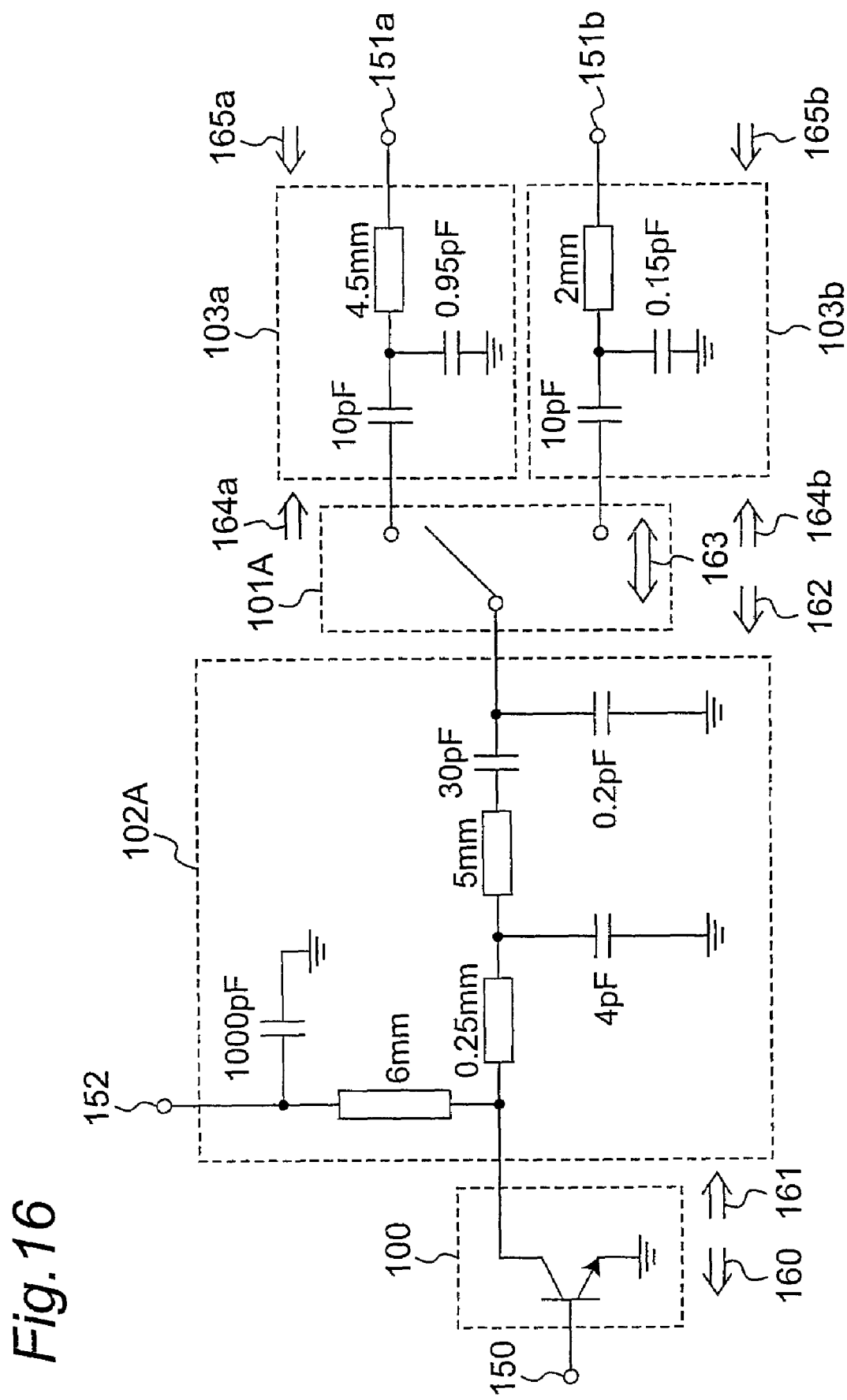
FIG. 16 is a circuit diagram of a high frequency circuit according to a ninth embodiment of the invention.
Figure 17A:
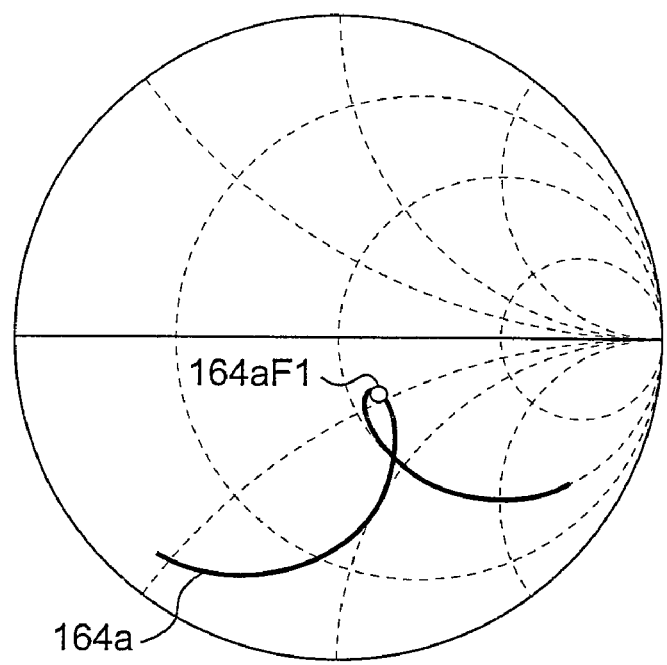
FIG. 17A describes the operation of the high frequency circuit according to a ninth embodiment of the invention.
Figure 17B:
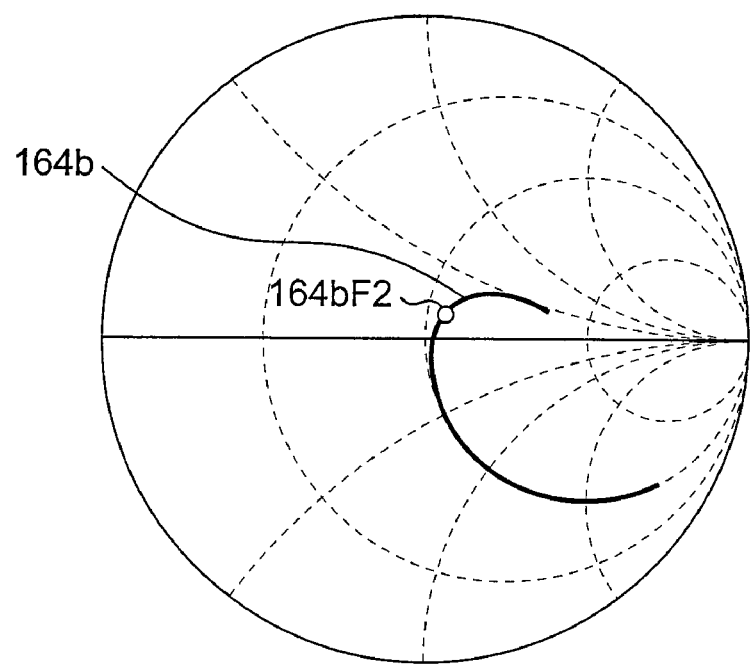
FIG. 17B describes the operation of the high frequency circuit according to a ninth embodiment of the invention.
Figure 18:
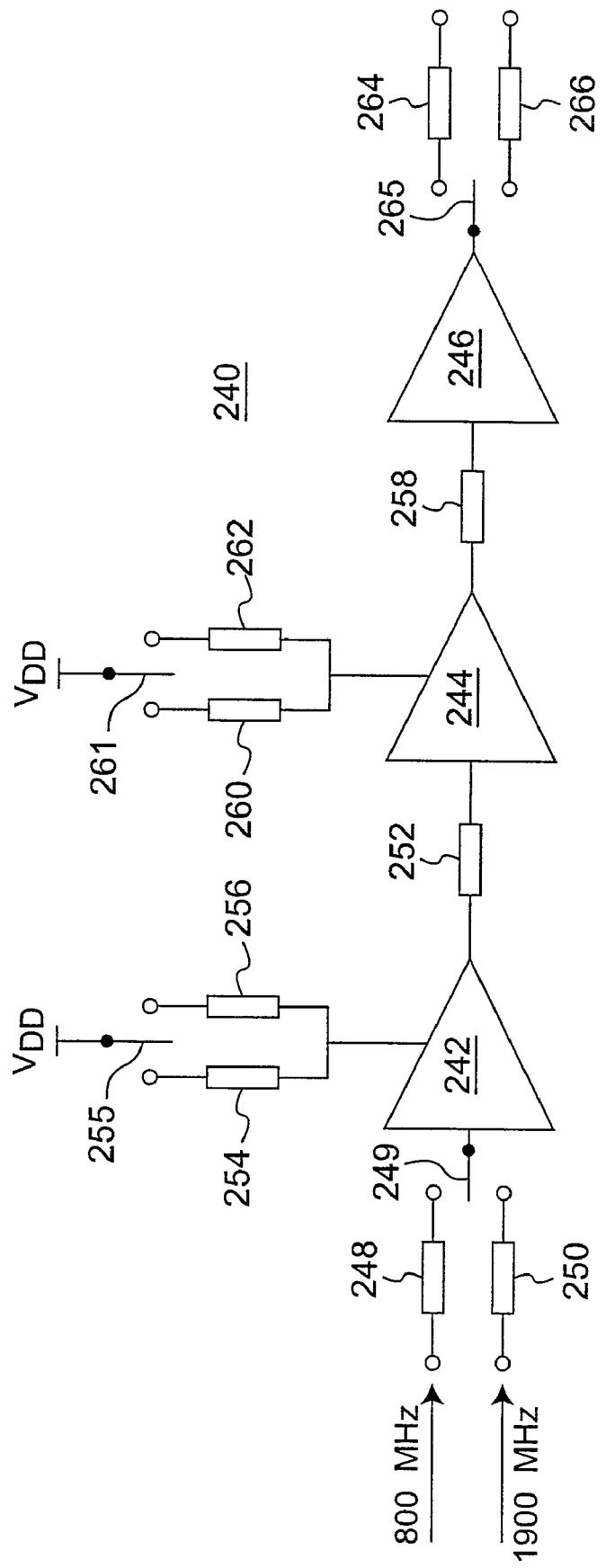
FIG. 18 is a block diagram of a high frequency power amplifier according to the related art.
Figure 19:
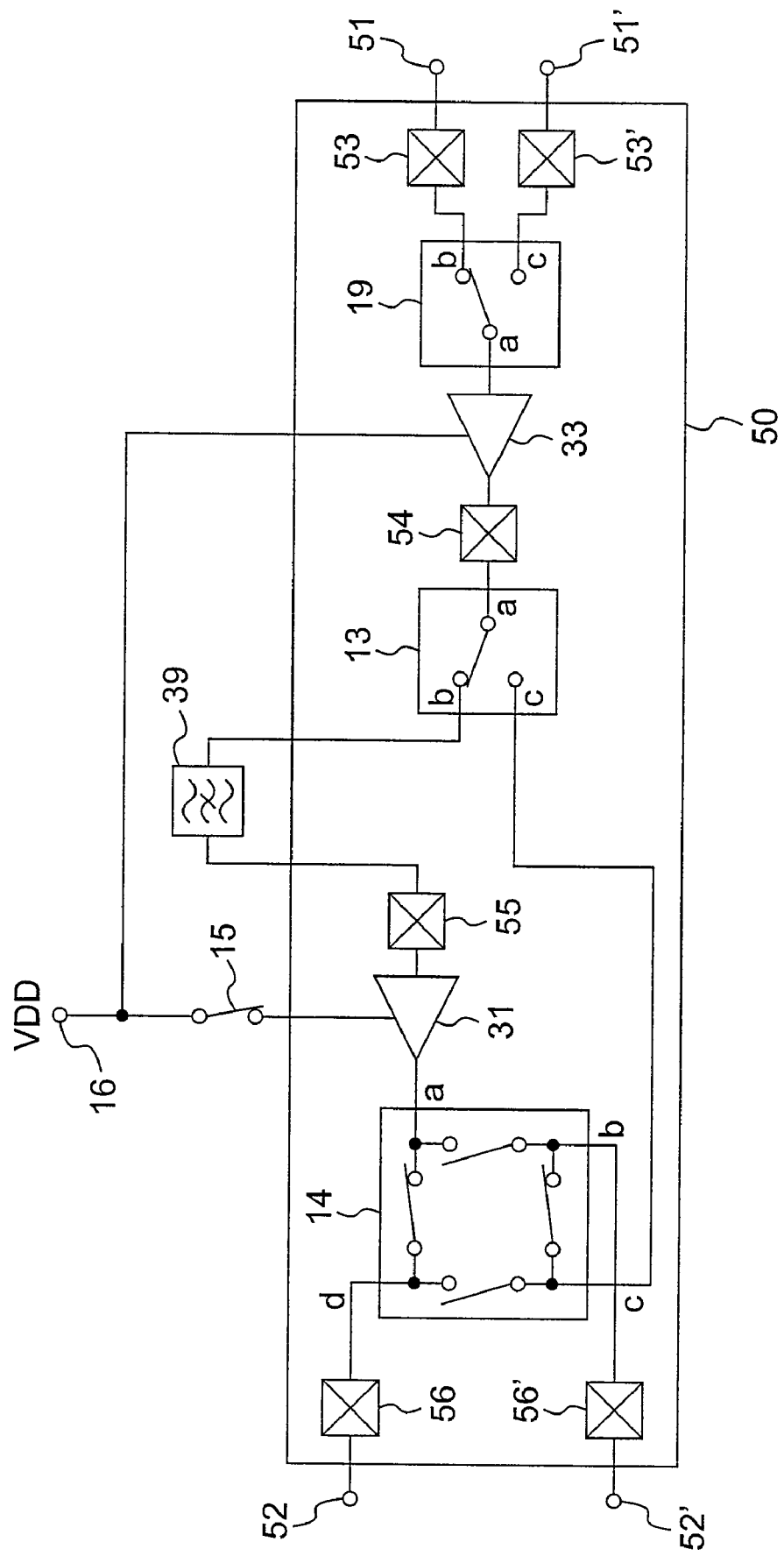
FIG. 19 is a block diagram of a high frequency power amplifier according to the related art.

This ninth embodiment of the invention describes a specific implementation of the first embodiment shown in FIG. 2 with reference to FIG. 16. FIG. 17A and FIG. 17B are Smith charts showing the input impedance 164 and 164a of the matching circuits 103a and 103b.

In FIG. 16 the final stage amplification unit 100 is a single common-emitter transistor. In the matching circuit 102A one side of a 1000 pF capacitance is connected to the power supply pin 152 to which the power supply voltage is applied, and the other side of the capacitance goes to ground. One end of a 6-mm long microstrip line is connected to the power supply pin 152, and the other end of the 6-mm microstrip line is connected to the collector of the final stage amplification unit 100 and a 0.25-mm microstrip line. The other end of this 0.25-mm microstrip line is connected to a 4-pF capacitance and a 5-mm microstrip line. The other end of the 4-pF capacitance goes to ground. The other end of the 5-mm microstrip line is connected to a 30-pF capacitance. The other end of the 30-pF capacitance is connected to a 0.2-pF capacitance, the other side of which goes to ground, and to the input pin of the switch unit 101A.

The two output pins of the switch unit 101A are connected to the 10-pF capacitance of the matching circuits 103a and 103b. In matching circuit 103a, the other end of the 10-pF capacitance is connected to a 0.95-pF capacitance, the other side of which goes to ground, and a 4.5-mm microstrip line. The other end of the microstrip line is connected to the output pin 151a. In matching circuit 103b, the other end of the 10-pF capacitance is connected to a 0.15-pF capacitance, the other side of which goes to ground, and a 2-mm microstrip line. The other end of this microstrip line is connected to output pin 151b.

In the ninth embodiment thus comprised, the switch unit 101A selects matching circuit 103a when the frequency of the amplified signal S100 is 1.7 GHz, and selects the matching circuit 103b when the frequency of the amplified signal S100 is 2.0 GHz. The input impedance 164a changes according to the frequency on a path as shown in the Smith chart in FIG. 17A, and at 1.7 GHz is positioned as indicated by point 164aF1. The actual input impedance 164a at this time is (60.3-j23.8) Ω. The input impedance 164b similarly changes according to the frequency on a path as shown in the Smith chart in FIG. 17B, and at 2.0 GHz is positioned as indicated by point 164bF2. The actual input impedance 164a at this time is (54.8-j5.9) Ω.

The input impedance 164a denoted by point 164aF1 is a complex conjugate of the output impedance 162 at 1.7 GHz. Likewise, the input impedance 164b denoted by point 164bF2 is a complex conjugate of the output impedance 162 at 2.0 GHz. More specifically, the resistance component of the output impedance 162 is approximately 55-60Ω at 1.7-2.0 GHz, and is sufficiently greater than the on impedance 163 of the switch unit 101A.

This ninth embodiment of the invention shows a specific implementation of the matching circuit 102A having an output impedance 162 sufficiently greater than the on impedance 163 of the switch unit 101A. Loss imposed by the switch unit 101A can thus be reduced.

Summary of the Embodiments

As described above, the load matching circuit 105A in the first aspect of the invention can extract the maximum power from the final stage amplification unit 100 by matching the output impedance 160 of the final stage amplification unit 100 on the input side. By simultaneously matching the 50-Ω load impedance 166 on the output side, the load matching circuit 105A can also supply the maximum power to the load and suppress waveform distortion caused by reflection waves from the load. Yet further, the load matching circuit 105A can also drive the on impedance 163 to a relative level that can be ignored by internally setting the absolute value of the output impedance 162 of the matching circuit 102A sufficiently higher than the absolute value of the on impedance 163 of the switch unit 101A. More specifically, the matching circuit 102A sets the input impedance 161 relatively low to match the output impedance 160 of the final stage amplification unit 100 while also setting the output impedance 162 enough greater than the input impedance 161 that the on impedance 163 can be ignored. As a result, when a switch unit 101A is disposed to the output side of the final stage amplification unit 100, loss from the switch unit 101A can be reduced, waveform distortion can be suppressed, and maximum power can be supplied to the load.

Furthermore, by using a switch unit 101A from which loss is reduced, the input impedance 164a, 164b and the output impedance 165a, 165b of the matching circuits 103a and 103b can be separately optimized based on frequency F1, F2 and power P1, P2. Signals can therefore be processed using an optimized matching circuit whether the used frequency band changes in a multiband cell phone that is compatible with different wireless frequencies, whether the transmission power changes in a multimode cell phone that is compatible with different wireless communication methods, or whether both the frequency band and transmission power change in a multiband, multimode cell phone. As a result, the arrangement of the matching circuit can be simplified, the matching circuit can be reduced in size, the matching precision of each matching circuit can be improved, and transmission power efficiency and waveform precision can therefore be improved. Cell phone coverage can therefore be increased and power consumption can be reduced.

The first aspect of the invention thus affords a small, high performance, multifunction high frequency circuit.

The second aspect of the invention affords multiband and multimode compatibility with a desired number of frequencies and transmission methods by using a SPnT switch unit 101B and matching circuits 103a, 103b, to 103n.

The matching circuit 102A in the third aspect of the invention is rendered as shown in FIG. 6, FIG. 10A to FIG. 10C, and FIG. 11 to switch a switch 107 on/off. By switching the switch 107 appropriately on/off based on the frequency F1, F2, the resistance component of the output impedance 162 can be held substantially constant and sufficiently greater than the on impedance 163. Insertion loss from the switch unit 101A can also be sufficiently reduced.

The matching circuit 102B in the fourth aspect of the invention is rendered as shown in FIG. 8 and switches 107a to 107m are turned on/off. By switching the switches 107a to 107m appropriately on/off based on the frequency F1, F2, the resistance component of the output impedance 162 can be held substantially constant and sufficiently greater than the on impedance 163. Insertion loss from the switch unit 101A can also be sufficiently reduced.

In the fifth aspect of the invention the matching circuit 103b is rendered as shown in FIG. 12B, and a switch 110 is controlled on/off according to the strength of the amplified signal S100 to change the input impedance 164b of the matching circuit 103b. The input impedance 161 can thus be optimized to the power, and the power efficiency of the final stage amplification unit 100 can be improved. The input impedance 161 can also be optimized for the frequency by using a switch unit 101A to select the matching circuits 103a and 103b according to the frequency. The fifth aspect of the invention can thus maximize power efficiency for both frequency and power.

The sixth aspect of the invention is rendered identically to the fifth aspect of the invention, but switches the switch 110 according to the peak power of the operating mode to change the input impedance 164b of the matching circuit 103b. The input impedance 161 can therefore be optimized according to the peak power of the operating mode to maximize the power efficiency of the final stage amplification unit 100.

Together with optimizing the input impedance 161 as described in the fifth and sixth aspects of the invention, the seventh aspect of the invention also adjusts the bias output signal S111 and supply voltage S112 of the final stage amplification unit 100. Power efficiency is further improved and distortion is further reduced by thus optimizing the bias output signal S111 and supply voltage S112 while also optimizing the input impedance 161.

The eighth aspect of the invention renders the switch unit 101B and matching circuits 103a, 103b, to 103n on a semiconductor chip, thereby reducing the size and cost of the high frequency circuit.

The switch units 101, 101A, 101B and the switches 106a, 106b, 106c, 107 are rendered using FETs in the embodiments described above, but can alternatively be rendered using other types of switch mechanisms, including HEMT, PIN diodes (positive-intrinsic-negative diodes), or micro electromechanical systems (MEMS). The switch units and switches can also be rendered using one or a plurality of transistors.

The final stage amplification unit 100 in the foregoing embodiments is rendered using a bipolar transistor, but other types of transistors can be used instead, including heterojunction bipolar transistors, silicon-germanium transistors, FET, and insulated gate bipolar transistors (IGBT). The final stage amplification unit 100 can be rendered using one or a plurality of transistors. The final stage amplification unit 100 can also be rendered as a multistage amplifier. When the final stage amplification unit 100 is rendered using such transistors, a common-emitter or common-source transistor is typically used. In this case the input node is the base or gate and the output node is the collector or drain, and the common node is the emitter or source.

The present invention can be used in a high frequency circuit, in a semiconductor device, and in a high frequency power amplifier.

Although the present invention has been described in connection with the preferred embodiments thereof with reference to the accompanying drawings, it is to be noted that various changes and modifications will be apparent to those skilled in the art. Such changes and modifications are to be understood as included within the scope of the present invention as defined by the appended claims, unless they depart therefrom.

What is claimed is:

1. A high frequency circuit comprising:
a final stage amplification unit that amplifies an input signal and outputs an amplified signal;
a first matching circuit that converts the impedance of the amplified signal which is input at a first input impedance, and outputs a first impedance-converted signal at a first output impedance;
a switch unit that switches passing the first impedance-converted signal on/off, and when on state passes the first impedance-converted signal with an on impedance and outputs the pass signal to an antenna; and
a control unit that generates a control signal denoting signal path selection information;
wherein said switch unit selects one of at least two signal paths based on the control signal, and turns passing the first impedance-converted signal through the selected path on.

2. The high frequency circuit described in claim 1, wherein said first matching circuit sets the first output impedance higher than the first input impedance.

3. The high frequency circuit described in claim 1, wherein said first matching circuit sets the first output impedance to greater than approximately 10Ω.

4. The high frequency circuit described in claim 1, wherein said control unit generates the control signal based on the frequency of the amplified signal.

5. The high frequency circuit described in claim 1, wherein said control unit generates the control signal based on the power of the amplified signal.

6. The high frequency circuit described in claim 1, wherein said control unit generates the control signal based on the peak power of the amplified signal.

7. The high frequency circuit described in claim 1, wherein said first matching circuit includes a switch that changes the first output impedance.

8. The high frequency circuit described in claim 7, wherein said switch changes the first output impedance based on the control signal.

9. The high frequency circuit described in claim 7, wherein said first matching circuit includes a capacitance connected to said switch.

10. The high frequency circuit described in claim 7, wherein said first matching circuit includes at least one of an inductor and microstrip line connected to said switch.

11. The high frequency circuit described in claim 1, further comprising:
a second matching circuit that converts the impedance of a pass signal which is input at a second input impedance, and outputs a second impedance-converted signal at a second output impedance to the antenna.

12. The high frequency circuit described in claim 11, wherein said second matching circuit includes a switch that changes the second input impedance.

13. The high frequency circuit described in claim 12, wherein said switch changes the second input impedance based on a control signal.

14. The high frequency circuit described in claim 12, wherein said second matching circuit includes a capacitance connected to said switch.

15. The high frequency circuit described in claim 12, wherein said second matching circuit includes at least one of an inductor and microstrip line connected to said switch.

16. The high frequency circuit described in claim 1, further comprising:
 a bias circuit that supplies a bias output that is a bias current or a bias voltage based on a control signal to said final stage amplification unit.

17. The high frequency circuit described in claim 1, further comprising:
 a power supply circuit that supplies a power supply voltage to said final stage amplification unit based on a control signal.

18. The high frequency circuit described in claim 1, wherein:
 said final stage amplification unit includes a bipolar transistor that switches between at least two emitter areas, or a field-effect transistor that switches between at least two gate widths, based on a control signal.

19. The high frequency circuit described in claim 1, wherein:
 said switch unit selects a signal path among N first impedance-converted signals which is output from said first matching circuit of N (where N is an integer of 2 or more).

20. The high frequency circuit described in claim 1, wherein:
 said first matching circuit sets the polarity of the reactance of the first output impedance when the control signal denotes selection information for one path opposite to the polarity when the control signal denotes selection information for the other path.

21. The high frequency circuit described in claim 1, wherein:
 said switch unit includes a switch that turns grounding the path on/off.

22. A semiconductor device comprising at least a part of said first matching circuit and said first switch unit of the high frequency circuit described in claim 11 on a first semiconductor chip.

23. The semiconductor device described in claim 22, wherein at least part of said second matching circuit is formed on a second semiconductor chip, and said final stage amplification unit is formed on a third semiconductor chip.

24. The semiconductor device described in claim 23, wherein said second semiconductor chip is identical to said first semiconductor chip.

25. The semiconductor device described in claim 23, wherein said third semiconductor chip is identical to said first semiconductor chip.

26. A high frequency power amplification device comprising mounted on a single circuit board:
 at least part of said first matching circuit and second matching circuit of the high frequency circuit described in claim 11; and
 a semiconductor device comprising at least a part of said first matching circuit and said first switch unit of the high frequency circuit on a first semiconductor chip.

* * * * *